(12) United States Patent
Kim

(10) Patent No.: US 9,082,475 B2
(45) Date of Patent: Jul. 14, 2015

(54) NONVOLATILE MEMORY DEVICE

(71) Applicant: Magnachip Semiconductor, Ltd., Cheongju-si (KR)

(72) Inventor: Jae-woon Kim, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 54 days.

(21) Appl. No.: 13/724,536

(22) Filed: Dec. 21, 2012

(65) Prior Publication Data

US 2013/0201773 A1    Aug. 8, 2013

(30) Foreign Application Priority Data

Feb. 6, 2012  (KR) .......................... 10-2012-0012053

(51) Int. Cl.
| | |
|---|---|
| G11C 17/16 | (2006.01) |
| G11C 7/22 | (2006.01) |
| G11C 17/18 | (2006.01) |
| G11C 7/14 | (2006.01) |
| G11C 29/02 | (2006.01) |

(52) U.S. Cl.
CPC .. *G11C 7/22* (2013.01); *G11C 7/14* (2013.01); *G11C 17/18* (2013.01); *G11C 29/027* (2013.01)

(58) Field of Classification Search
CPC ...................................................... G11C 17/16
USPC ............................................................ 365/96
See application file for complete search history.

(56) References Cited

U.S. PATENT DOCUMENTS

| | | | | |
|---|---|---|---|---|
| 7,710,813 | B1 * | 5/2010 | Im et al. ..................... | 365/225.7 |
| 2012/0242288 | A1 * | 9/2012 | Birke et al. .................. | 320/109 |
| 2012/0257435 | A1 * | 10/2012 | Lin et al. ......................... | 365/96 |
| 2013/0170276 | A1 * | 7/2013 | Daigle ............................ | 365/96 |
| 2013/0286710 | A1 * | 10/2013 | Hall et al. ....................... | 365/96 |

FOREIGN PATENT DOCUMENTS

KR    10-2007-0047788    5/2007

\* cited by examiner

*Primary Examiner* — Hoai V Ho
*Assistant Examiner* — Min Huang
(74) *Attorney, Agent, or Firm* — NSIP Law

(57) ABSTRACT

A nonvolatile memory device includes an operation control unit, a reference voltage generating unit, and a sensing unit. The operation control unit is configured to select a unit cell from unit cells to perform reading and writing operations. The reference voltage generating unit is configured to voltage-divide a read voltage using series-connected resistors and generate a reference voltage based on the voltage-divided read voltage. The sensing unit is configured to compare a size of a voltage through an e-fuse of the selected unit cell based on the read voltage with the reference voltage, and sense data of the e-fuse of the selected unit cell. The nonvolatile memory device also includes a read current supply unit configured to output the read voltage to the unit cells during a reading operation of the nonvolatile memory device.

26 Claims, 17 Drawing Sheets

NONVOLATILE MEMORY DEVICE

CROSS-REFERENCE TO RELATED APPLICATIONS

This application claims priority from Korean Patent Application No. 10-2012-0012053, filed on Feb. 6, 2012, in the Korean Intellectual Property Office, the disclosure of which is incorporated herein by reference in its entirety.

BACKGROUND

1. Field of the Invention

The following description relates to a nonvolatile memory device, which generates reference voltage using a plurality of resistors and detects a status of e-fuse with accuracy using the generated reference voltage.

2. Description of the Related Art

Nonvolatile memory functions to retain stored information even when the electricity is cut-off, and is used in power management integrated circuits (PMICs), memory card data (MCD), display driving chip, complementary metal-oxide-semiconductor (CMOS) image sensor, or the like. Recently, one time programmable (OTP) memory has been adopted for functions such as analogue trimming, security code, embedded nonvolatile memory device.

The OTP memory allows one programming with desired information, and is mainly categorized into antifuse OTP memory and e-fuse OTP memory. The antifuse-based OTP memory is programmable by applying high voltage at two ends of thin gate oxide layer MOS capacitor to electrically shunt the fuse. The antifuse-based OTP memory has small cell areas and, thus, can be implemented in low-electricity electrical devices. Further, because the memory consumes little electricity during programming, byte-unit programming is possible.

However, because high voltage is required to break the oxide layer, a separate programming voltage is required. Further, as the thickness of the oxide layer decreases, programming operation can fail due to soft breakdown.

E-fuse OTP memory is programmable by flowing an excess current of several tens of mA to poly fuse to vary resistance value of the fuse. Because relatively high programming voltage is not required in the programming, the e-fuse OTP memory is less process-dependent than the antifuse-based OTP and, thus, is implemented in many processes.

In order to determine whether or not the e-fuse is in an initial state, the e-fuse OTP memory compares the voltage output from the e-fuse with the reference voltage. However, the reference voltage output is conventionally generated using a transistor, which provides a shortcoming of being sensitive to the characteristics of the transistor such as process change, temperature and voltage characteristics.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one embodiment, a nonvolatile memory device is provided that generates a reference voltage using a plurality of resistors, and detects status of e-fuse with accuracy by using the generated reference voltage.

In accordance with an illustrative example, a nonvolatile memory device includes an operation control unit configured to select a unit cell from unit cells to perform reading and writing operations; a reference voltage generating unit configured to voltage-divide a read voltage using series-connected resistors and generate a reference voltage based on the voltage-divided read voltage; and a sensing unit configured to compare a size of a voltage through an e-fuse of the selected unit cell based on the read voltage with the reference voltage, and sense data of the e-fuse of the selected unit cell.

The nonvolatile memory device also includes a read current supply unit configured to output the read voltage to the unit cells during a reading operation of the nonvolatile memory device.

The unit cells include an e-fuse configured to store 1-bit information; a first switching device configured to selectively output the read voltage to the e-fuse of the unit cells; and a second switching device configured to enable an electric current to flow through the e-fuse of the unit cells according to the read voltage.

The first switching device comprises an n-type metal-oxide-semiconductor field-effect transistor (nMOS), with a drain connected to the read current supply unit, a gate receiving a cell select signal, and a source connected to one end of the e-fuse, and the second witching device is an nMOS, with a drain connected to the other end of the e-fuse, a gate receiving the cell select signal, and a source being grounded.

The unit cells include an input unit configured to provide the e-fuse with a write voltage during writing operation of the nonvolatile memory device; and a third switching device configured to enable electric current to flow through the e-fuse according to the write voltage.

The third switching device is an n-type metal-oxide-semiconductor field-effect transistor (nMOS), with a drain connected to one end of the e-fuse, a gate receiving a cell select signal, and a source being grounded.

The nonvolatile memory device also includes a read/write control unit configured to selectively enable electric current based on a read voltage or electric current based on a write voltage to flow through the unit cells.

The unit cells include a fourth switching device configured to selectively output the read voltage to the e-fuse, wherein one end of the e-fuse is connected to the fourth switching device and the other end is connected to the read/write control unit.

A drain of the fourth switching device receives the read voltage, a gate receives a cell select signal, and a source is connected to one end of the e-fuse.

The unit cells further comprise a fifth switching device configured to enable electric current to flow through the e-fuse according to the write voltage.

The fifth switching device is an n-type metal-oxide-semiconductor field-effect transistor (nMOS), with a drain connected to one end of the e-fuse, a gate receiving a cell select signal, and a source being grounded.

The read/write control unit includes a sixth switching device configured to selectively output a write voltage to the unit cells during the writing operation of the nonvolatile memory device; and a seventh switching device configured to enable electric current to flow through the unit cells based on the read voltage during the reading operation of the nonvolatile memory device.

The sixth switching device is a p-type metal-oxide-semiconductor field-effect transistor (pMOS), with a source receiving the write voltage, a gate receiving a write control signal, and a drain commonly connected to one end of the seventh switching device and the e-fuse, and the seventh switching device is an n-type metal-oxide-semiconductor field-effect transistor (nMOS), with a drain commonly connected to a drain of the sixth switching device and the e-fuse, a gate receiving a read control signal, and a source being grounded.

The read current supply unit includes an eighth switching device configured to selectively output a read voltage to the unit cells during the reading operation of the nonvolatile memory device; and a first resistor comprising a first preset resistance.

The eighth switching device is a p-type metal-oxide-semiconductor field-effect transistor (pMOS), with a source receiving a read voltage, a gate receiving an inversed read control signal, and a drain connected to one end of the first resistor. One end of the first resistor is connected to drain of the eighth switching device, and the other end is commonly connected to the unit cells and a comparing unit.

The sensing unit determines that the selected e-fuse is not programmed when the voltage through the selected e-fuse is lower than the reference voltage, and determines that the selected e-fuse is programmed when the voltage through the selected e-fuse is greater than the reference voltage.

The reference voltage generating unit includes a second resistor comprising a second preset resistance; a third resistor comprising a third preset resistance and configured to be connected in series to the second resistor; a ninth switching device configured to selectively output the read voltage to the second resistor; and a tenth switching device configured to enable an electric current to flow through the second and third resistors according to the read voltage.

The reference voltage generating unit further comprises an eleventh switching device configured to selectively connect the second and third resistors.

The ninth switching device is a p-type metal-oxide-semiconductor field-effect transistor (pMOS), with a source receiving a read voltage, a gate receiving an inversed read control signal, and a drain connected to one end of the second resistor, one end of the second resistor is connected to a drain of the ninth switching device and the other end is connected to the sensing unit, the eleventh switching device is an n-type metal-oxide-semiconductor field-effect transistor (nMOS), with a drain commonly connected to the other end of the second resistor and the sensing unit, a gate receiving a read control signal, and a source connected to one end of the third resistor, one end of the third resistor is connected to a source of the eleventh switching device, and the tenth switching device is an nMOS, with a drain connected to the other end of the third resistor, a gate receiving a read control signal, and a source being grounded.

The reference voltage generating unit further includes a reference voltage increasing unit configured to increase the reference voltage; and a reference voltage decreasing unit configured to decrease the reference voltage.

The reference voltage decreasing unit includes a fourth resistor configured to be connected in series with the second resistor, and configured to comprise a fourth preset resistance; and a twelfth switching device configured to selectively output the fourth resistor with the read voltage.

The twelfth switching device is a p-type metal-oxide-semiconductor field-effect transistor (pMOS), with a source receiving the read voltage, a gate receiving a first test control signal, and a drain connected to one end of the fourth resistor.

The reference voltage decreasing unit comprises a fifteenth switching device comprising an on-resistance lower than on-resistance of the eleventh switching device, and configured to be connected in parallel with the eleventh switching device.

The reference voltage increasing unit includes a fifth resistor configured to be connected in series with the third resistor, and configured to comprise has a fifth preset resistance; and a thirteenth switching device configured to selectively enable electric current to flow through the second, third, and fifth resistors according to the read voltage.

The thirteenth switching device is an n-type metal-oxide-semiconductor field-effect transistor (nMOS), with a drain connected to the other end of the fifth resistor, a gate receiving a second test control signal, and source being grounded.

The reference voltage increasing unit comprises a sixteenth switching device comprising an on-resistance higher than on-resistance of the eleventh switching device, and configured to be connected in parallel with the eleventh switching device.

In embodiments, since the reference voltage is generated using non-salicide poly resistors having exact resistances, the nonvolatile memory device is capable of detecting the status of the e-fuse with accuracy.

BRIEF DESCRIPTION OF THE DRAWINGS

The above and/or other aspects of the present inventive concept will be more apparent by describing certain exemplary configurations with reference to the accompanying drawings, in which.

DETAILED DESCRIPTION OF EXEMPLARY EMBODIMENTS

Figure 1:
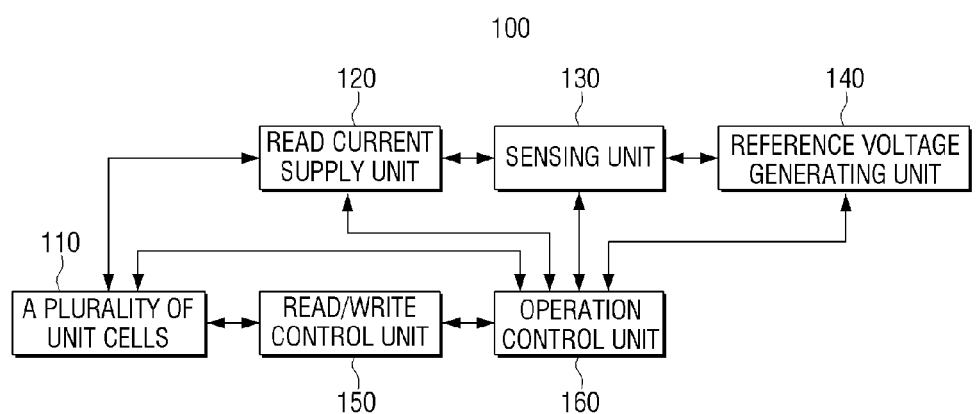
FIG. 1 is a block diagram of a nonvolatile memory device, according to an embodiment.

Certain exemplary configurations of the present inventive concept will now be described in greater detail with reference to the accompanying drawings.

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness. Throughout the drawings and the detailed description, unless otherwise described, the same drawing reference numerals will be understood to refer to the same elements, features, and structures. The relative size and depiction of these elements may be exaggerated for clarity, illustration, and convenience.

It will be understood that when an element is referred to as being "on," "connected to," or "operatively connected to" another element or unit, it can be directly on or connected to another element or unit through intervening elements or units. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

The units described herein may be implemented using hardware components. The hardware components may include, for example, controllers, sensors, processors, generators, drivers, resistors, filters, transistors, junction gate field-effect transistor (JFET), n-type or p-type metal-oxide-semiconductor field-effect transistor (MOSFETs), metal-insulator-semiconductor FET (MISFETs), metal-oxide-semiconductors (MOSs), and other equivalent electronic components.

FIG. 1 is a block diagram of a nonvolatile memory device, according to an embodiment.

Referring to FIG. 1, the nonvolatile memory device 100, according to an embodiment, includes a plurality of unit cells 110, a read current supply unit 120, a sensing unit 130, a reference voltage generating unit 140, a read/write control unit 150, and an operation control unit 160.

Figure 2:
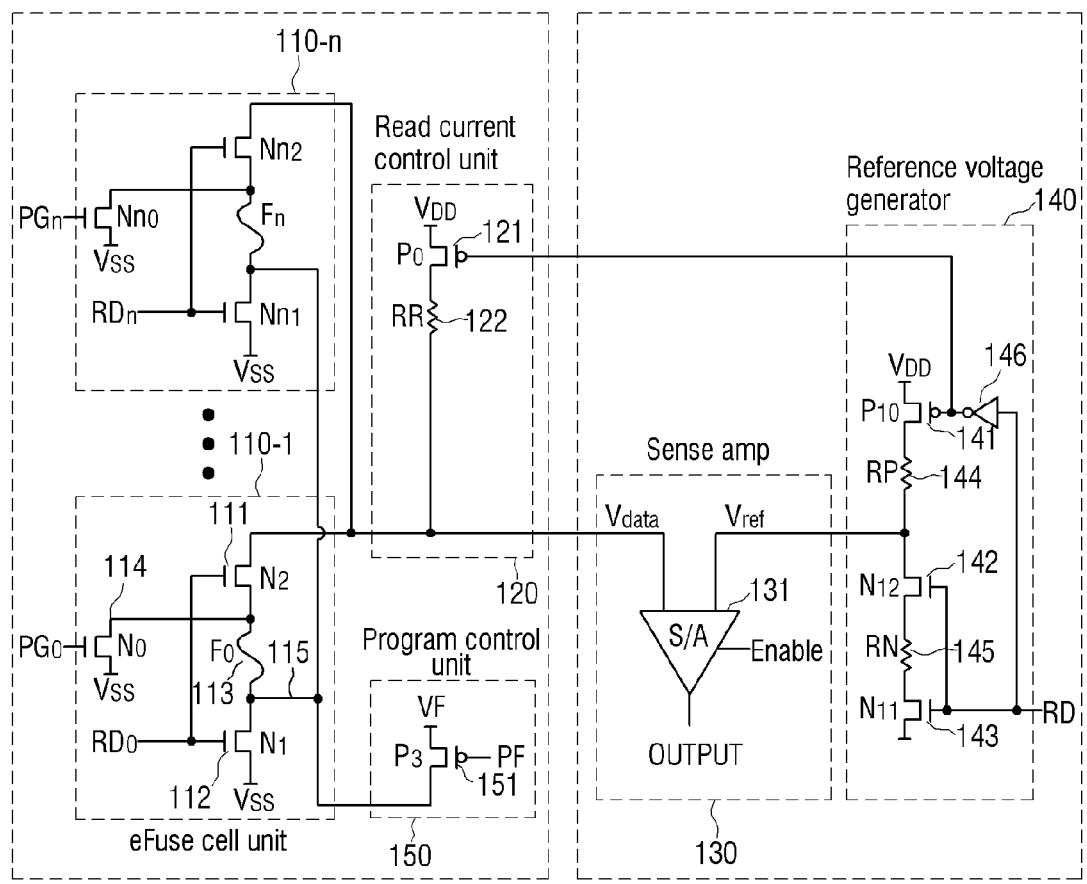
FIG. 2 is a circuit diagram of a nonvolatile memory device, according to a first embodiment.
Figure 7:
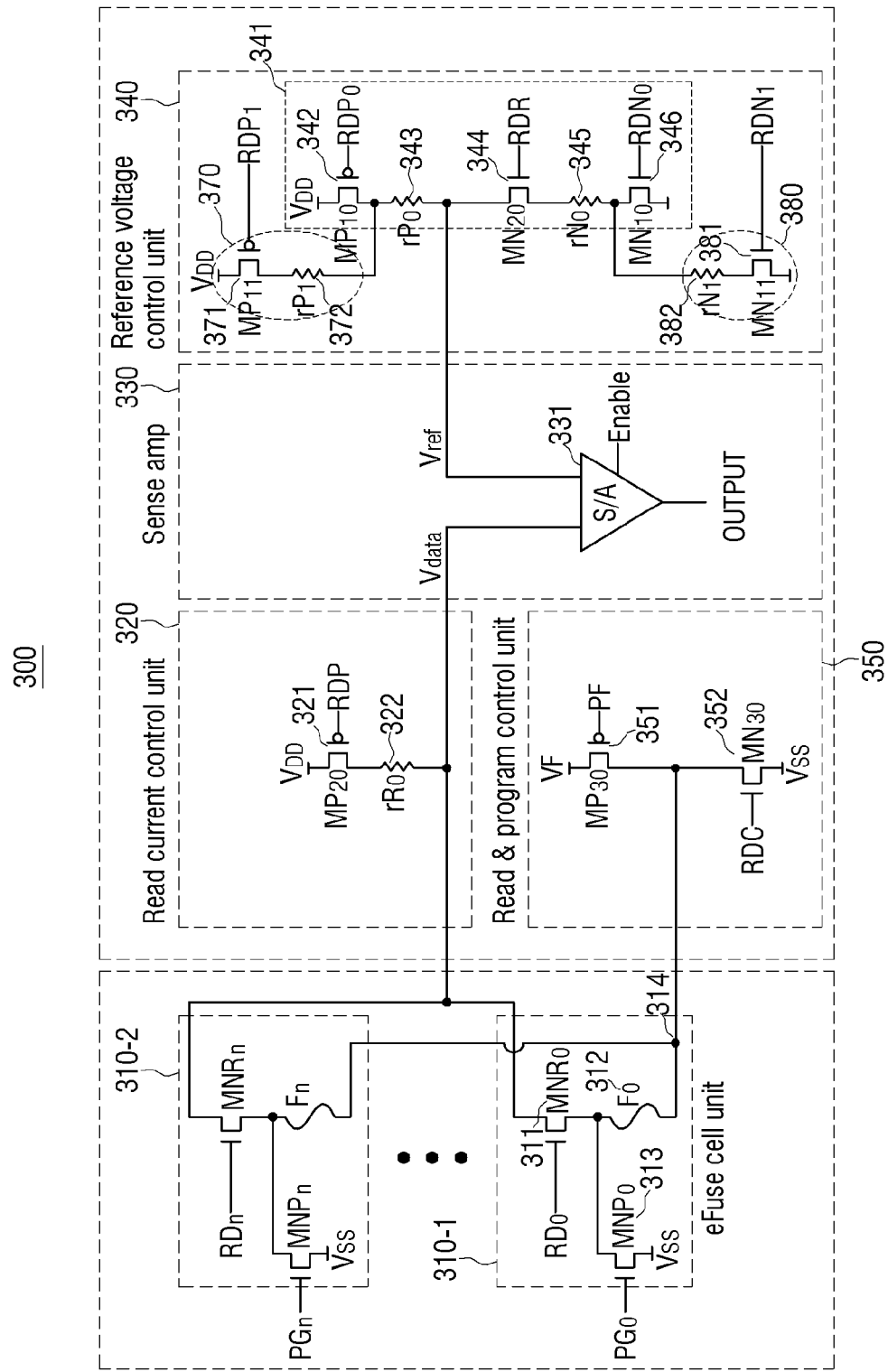
FIG. 7 is a circuit diagram of a nonvolatile memory device, according to a second embodiment.

Each of the plurality of unit cells 110 may include an e-fuse. In one configuration, each of the plurality of unit cells 110 may include three switching devices and one e-fuse, as illustrated in FIG. 2 or, in the alternative, each may include two switching devices and one e-fuse, as illustrated in FIG. 7. The e-fuse may be a poly fuse that changes resistance by application of an overcurrent. By way of example, the e-fuse may have approximately 50-200Ω before programming and then have approximately 3 k~10 kΩ after programming.

The read current supply unit 120 provides read voltage to the plurality of unit cells 110. For instance, the read current supply unit 120 provides the read voltage to the plurality of unit cells 110 during reading operation of the nonvolatile memory device 100. Meanwhile, the read current supply unit 120 may include one switching device, $P_0$, 121 and one resistor, RR, 122 as illustrated in FIGS. 2 and 7.

The sensing unit 130 compares a size of voltage from the read voltage, $V_{data}$, of e-fuse of the selected unit cell with the reference voltage size, $V_{REF}$, and determines the status of the e-fuse of the selected unit cell. For example, the sensing unit 130 determines that the selected e-fuse is not programmed when the size of the voltage, $V_{data}$, through the selected e-fuse is lower than the the reference voltage, $V_{REF}$, generated at the reference voltage generating unit 140. In the alternative, the sensing unit 130 determines that the selected e-fuse is programmed, when the size of the voltage, $V_{data}$, through the selected e-fuse is greater than the size of the reference voltage, $V_{REF}$, generated at the reference voltage generating unit 140.

The reference voltage generating unit 140 voltage-divides the read voltage using the plurality of series-connected resistors and generates a reference voltage, $V_{REF}$, based on the voltage-divided voltage. The structural configuration and operation of the reference voltage generating unit 140 will be explained in greater detail below with reference to FIGS. 2, 7 and 16.

The read/write control unit 150 allows electric current, according to read voltage or write voltage, to selectively flow through the plurality of unit cells. For instance, during a reading operation of the nonvolatile memory device 100, the read/write control unit 150 allows the electric current according to the read voltage to flow through the unit cell selected from among the plurality of unit cells. During writing operation of the nonvolatile memory device 100, the read/write control unit 150 may allow the electric current according to the write voltage to flow through the unit cell selected from among the plurality of unit cells. In one illustrative example, the read/write control unit 150 may be included in the unit cell.

The operation control unit 160 controls the overall functionality of the structural elements or components of the nonvolatile memory device 100. For instance, depending on the operation mode of the nonvolatile memory device 100, the operation control unit 160 controls the functionality or operation of corresponding structural elements or components of the nonvolatile memory device 100. By way of example, in read operation mode, the operation control unit 160 selects the unit cell to perform read operation from among the plurality of unit cells, outputs a cell select signal to the selected unit cell, and controls the read current supply unit 120 and the read/write control unit 150 so that a read voltage is supplied to the selected unit cell. The operation control unit 160 controls the reference voltage generating unit 140 to generate a reference voltage and controls the sensing unit 130 to compare the generated reference voltage with the voltage of the e-fuse of the selected unit cell.

In a write operation mode, the operation control unit 160 selects the unit cell from among the plurality of unit cells to perform write operation, outputs the cell select signal to the selected unit cell, and controls the read/write control unit 150 to supply the write voltage to the selected unit cell.

In a test operation mode, the reference voltage generating unit 140 is controlled to generate a reference voltage higher or lower than the reference voltage in the read operation. The test operation in the test operation mode will be explained in greater detail below with reference to FIGS. 10 and 11.

FIG. 2 is a circuit diagram of a nonvolatile memory device, according to a first embodiment.

Referring to FIG. 2, the nonvolatile memory device 100, according to the first embodiment, includes a plurality of unit cells 110, a read current supply unit 120, a sensing unit 130, a reference voltage generating unit 140 and a read/write control unit 150.

Each of the plurality of unit cells 110 includes an e-fuse. For example, each of the plurality of unit cells 110 includes a first switching device 111, a second switching device 112, an e-fuse 113, a third switching device 114 and an input unit 115.

The e-fuse 113 is a 1-bit programmable memory device that increases resistance in accordance with an overcurrent. In one example, one end of the e-fuse 113 is commonly connected to the source of the first switching device 111 and to the drain of the third switching device 114. The other end of the e-fuse 113 is commonly connected to the input unit 115 and the drain of the second switching device 112. In one example, the e-fuse 113 may be a poly fuse, with approximately 50-200Ω before programming and approximately 3 k-10 kΩ after programming.

The first switching device 111 selectively provides the e-fuse 113 with read voltage. The first switching device 111 may be a nMOS (n-channel MOS), with a drain connected to the read current supply unit, a gate receiving a cell select signal, and a source connected to one end of the e-fuse 113.

The second switching device 112 allows electric current to flow the e-fuse 113 according to the read voltage. For instance, the second switching device 112 is an nMOS with a drain connected to the other end of the e-fuse 113, a gate receiving a cell select signal, and a source being grounded.

The third switching device 114 allows electric current to flow the e-fuse 113 according to write voltage. The third switching device 114 may be a nMOS with a drain connected to one end of the e-fuse 113, a gate receiving a cell select signal, and a source being grounded. Also, the third switching device 114 may be sized larger than the first and second switching devices 111, 112, in consideration of the write electric current, which is greater than the read electric current, flowing through the third switching device 114.

The input unit 115 provides the e-fuse 113 with the write voltage during a writing operation of the nonvolatile memory device. The input unit 115 may be connected to the drain of the fourteenth switching device 151 formed inside the read/write voltage unit 150.

The read current supply unit 120 provides the plurality of unit cells 110 with read voltage. The read current supply unit 120 may include an eighth switching device 121 and a first resistor 122.

The eighth switching device 121 selectively outputs the read voltage to the plurality of unit cells 110 during a reading operation of the nonvolatile memory device. The eighth switching device 121 may be a pMOS (p-channel MOS) with a source receiving the read voltage, a gate receiving an inversed read control signal, and a drain connected to one end of the first resistor 122.

The first resistor 122 has a first preset resistance. One end of the first resistor 122 is connected to the drain of the eighth switching device 121 and the other end is commonly connected to the plurality of unit cells 110 and the sensing unit 130. The first preset resistance may be a median (e.g., approximately 1.5-5Ω) between the resistance of the e-fuse 113 when non-programmed (e.g., approximately 50-200Ω) and the minimum resistance when programmed (e.g., approximately 3 k-10 kΩ). The first resistor 122 may be implemented as a non-salicide poly resistor including a predetermined resistance.

Using the read voltage, the sensing unit 130 compares the size of the voltage through the e-fuse 113 of the selected unit cell with the size of the reference voltage and detects the data of the e-fuse 113 of the selected unit cell. The sensing unit 130 may be implemented as sense-AMP, which receives the voltage of the unit cell and the reference voltage, respectively, and outputs a voltage difference therebetween. Accordingly, the sensing unit 130 determines that the selected e-fuse 113 is not programmed when the size of the voltage through the selected e-fuse 113 is lower than the reference voltage generated at the reference voltage generating unit 140. The sending unit 130 determines that the selected e-fuse 113 is programmed when the size of the voltage through the selected e-fuse 113 is greater than the size of the reference voltage generated at the reference voltage generating unit 140. In one illustrative example, the connecting end of the sense-AMP may be changed so that the sense-AMP may determine that the programming is not done when the size of the reference voltage is lower than the voltage of the e-fuse 113.

The reference voltage generating unit 140 voltage-divides the read voltage using a plurality of series-connected resistors and generates a reference voltage based on the voltage-divided voltage. In one example, the reference voltage generating unit 140 includes a second resistor 144, a third resistor 145, a ninth switching device 141, a tenth switching device 143, and an eleventh switching device 142.

The second resistor 144 has a second preset resistance. One end of the second resistor 144 is connected to the source of the ninth switching device 141 and the other end thereof is commonly connected to the sensing unit 131 and the drain of the eleventh switching device 142. The second preset resistance may be a median (e.g., approximately 1.5-5Ω) between the resistance (e.g., approximately 50-200Ω) when non-programmed and a minimum resistance when programmed (e.g., approximately 3 k-10 kΩ). The second resistor 144 may be implemented as a non-salicide poly resistor with a predetermined resistance.

The third resistor 145 has a third preset resistance connected to the second resistor in series. One end of the third resistor 145 is connected to the source of the eleventh switching device 142 and the other end of the third resistor 145 is connected to the drain of the tenth switching device 143. The third preset resistance may be a median (e.g., approximately 1.5-5Ω) between a resistance of, for example, approximately 50-200Ω, when non-programmed and a minimum resistance when programmed of, for example, approximately 3 k-10 kΩ. The third resistor 145 is implemented as a non-salicide poly resistor to have a predetermined resistance.

In one illustrative example, the first, second and third resistors 122, 144, 145 may have the same or similar resistance. Referring to FIG. 2, in order to prevent influence from the transistor, which is sensitive to the changes in processing and temperature characteristics, the reference voltage generating unit 140 is configured symmetrically to the unit cells 110 and the read current supply unit 120.

The ninth switching device 141 selectively provides the read voltage to the second resistor 144. To be specific, the ninth switching device 141 may be implemented as a pMOS, including a source receiving the read voltage, a gate receiving an inversed read control signal, and a drain connected to one end of the second resistor 144.

The tenth switching device 143 allows the electric current to flow the second and third resistors according to the read voltage. To be specific, the tenth switching device 143 may be implemented as an nMOS, including a drain connected to another end of the third resistor 145, a gate receiving a read control signal, and a source being grounded.

The eleventh switching device 142 selectively connects the second and third resistors 144, 145. The eleventh switching device 142 may be implemented as a nMOS, including a drain commonly connected to another end of the second resistor 144 and the sensing unit 130, a gate receiving a read control signal, and a source connected to one end of the third resistor 145.

The read/write control unit 150 allows the electric current, according to the read voltage, to flow the plurality of unit cells. The read/write control unit 150 may be configured as a fourteenth switching device 151.

The fourteenth switching device 151 selectively provides the write voltage during the writing operation of nonvolatile memory device to the unit cells. The fourteenth switching device 151 may be a pMOS, including a source receiving a write voltage, a gate receiving a write control signal, and a drain commonly connected to the other end of the e-fuse 113 and the drain of the second switching device 112. In one example, the fourteenth switching device 151 may have a larger size than the first and second switching devices 111, 112, in consideration that a write electric current is larger than the read electric current flowing therethrough.

The circuit configuration of the nonvolatile memory device, according to the first embodiment, has been explained above. Hereinbelow, the reading operation is explained with reference to FIG. 3 and the writing operation is explained with reference to FIG. 4.

Figure 3:
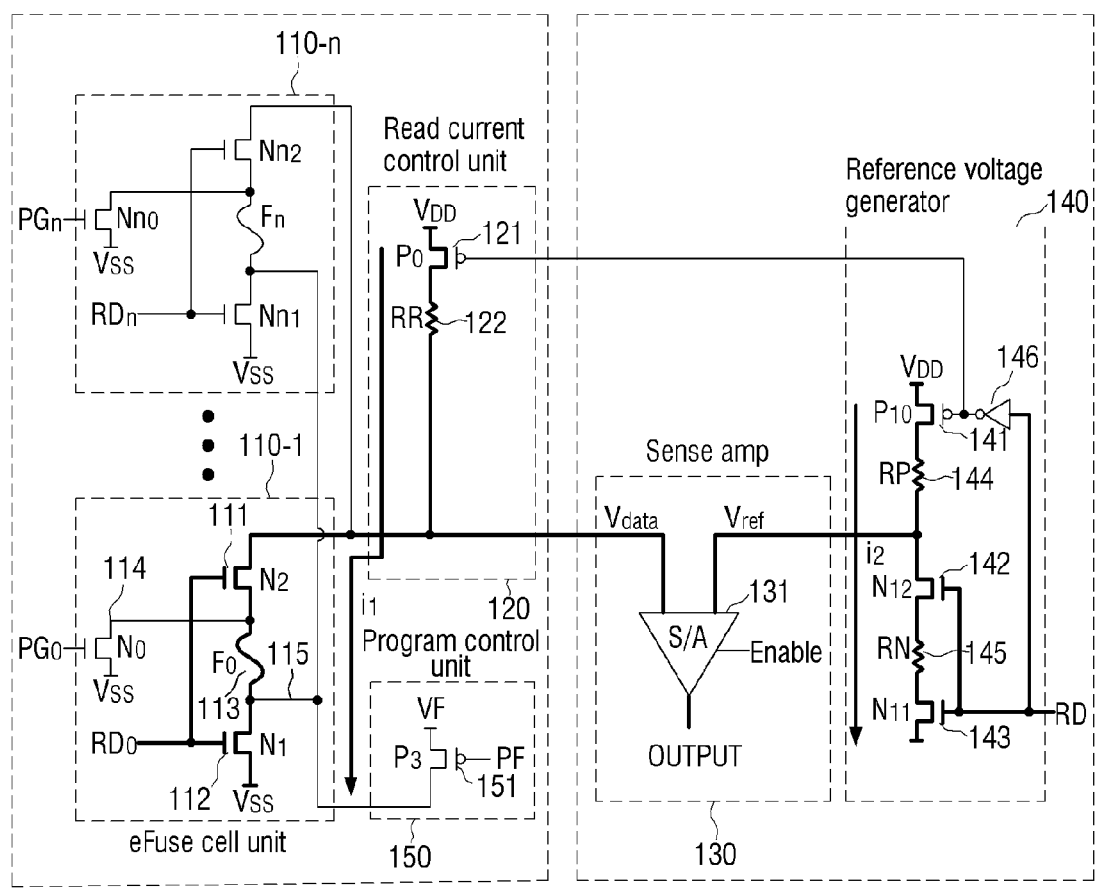
FIG. 3 is a circuit diagram provided illustrating a reading operation of a nonvolatile memory device, according to a first embodiment.

FIG. 3 is a circuit diagram provided illustrating the read operation of the nonvolatile memory device, according to the first embodiment.

Referring to FIG. 3, the operation control unit 160 selects a unit cell to perform the read operation and provides the cell select signal to the corresponding unit cell 110-1. Accordingly, the first and second switching devices 111, 112 are turned-on. The third and fourteenth switching devices 114, 151 are in an off-state.

The operation control unit 160 provides the read current supply unit 120 with the read control signal so that the read voltage is provided to the selected unit cell and the reference voltage is generated. Accordingly, the eighth, ninth, tenth and eleventh switching devices 121, 141, 143, 142 are turned-on.

As the switching devices are turned-on, an electric current path $i_1$ is formed along the eighth switching device 121, the first resistor 122, the first switching device 111, the e-fuse 113, and the second switching device 112.

An electric current path $i_2$ is also formed between the ninth switching device 141, the second resistor 144, the eleventh switching device 142, the third resistor 145, and the tenth switching device 143.

Because the same number of switching devices exists through the electric current paths, $i_1$ and $i_2$, negative characteristics of the transistor can be prevented, and it is possible to determine whether the resistance of the e-fuse exceeds the reference resistance. By way of example, because the e-fuse has the resistance lower than the first to third resistances when the e-fuse is before programming, the voltage at the e-fuse is lower than a voltage value, which is a voltage divided by the second and third resistors. On the contrary, because the e-fuse has a resistance higher than the first to third resistors when the e-fuse is programmed, the voltage at the e-fuse is higher than the voltage value, which is a voltage divided by the second and third resistors. Accordingly, by comparing the voltage at the e-fuse with the reference voltage, the sensing unit 130 may determine whether the e-fuse is programmed or not.

Figure 4:
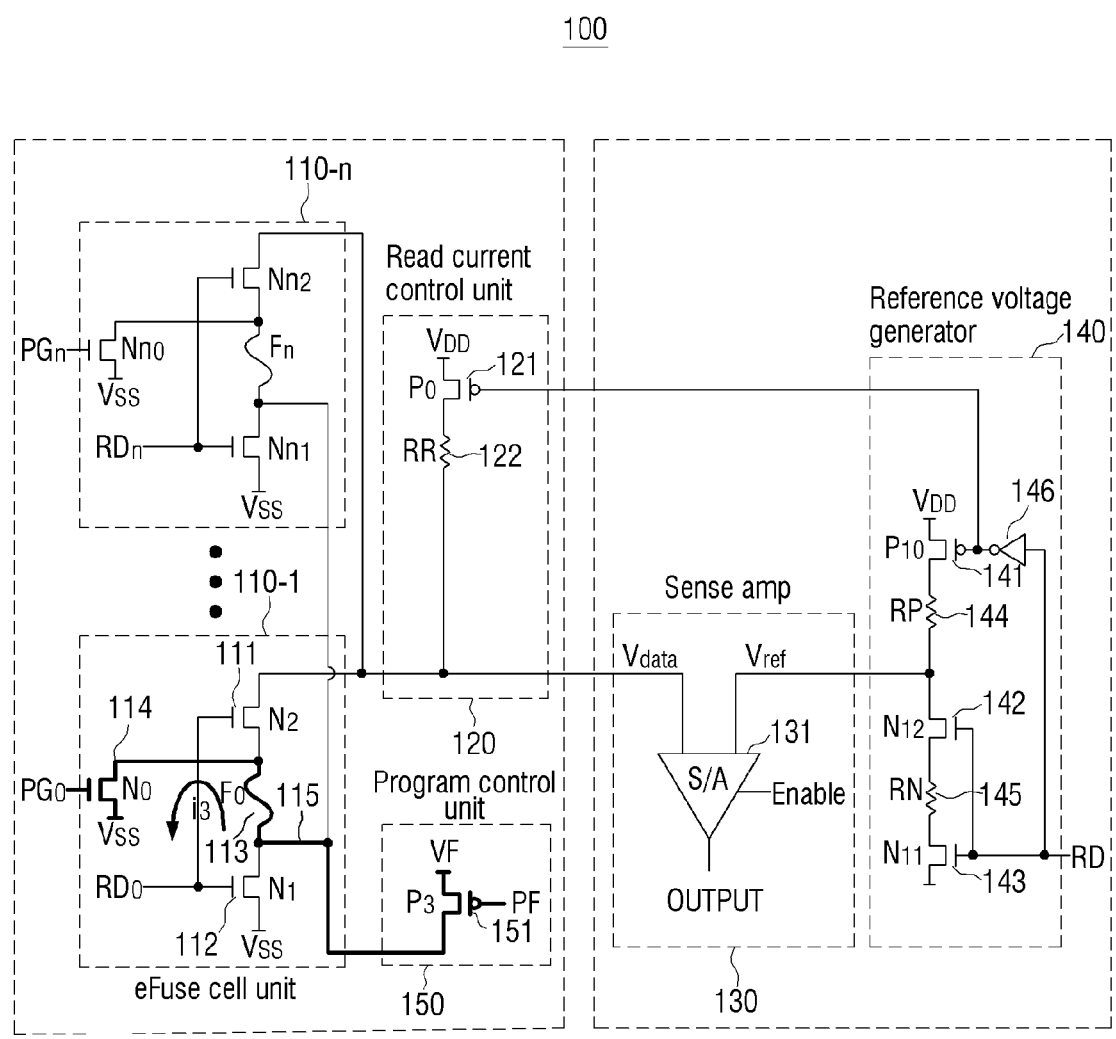
FIG. 4 is a circuit diagram provided illustrating a writing operation of a nonvolatile memory device, according to a first embodiment.

FIG. 4 is a circuit diagram provided illustrating the writing operation of the nonvolatile memory device, according to the first embodiment.

Referring to FIG. 4, the operation control unit 160 selects a unit cell to perform writing operation and provides a cell select signal to the corresponding unit cell 110-1. Accordingly, the third and fourteenth switching devices 114, 151 are turned-on. The other switching devices are in an off state.

As the third switching device 114 is turned-on, an electric current path $i_3$ is formed between the fourteenth switching device 151, the input unit 115, the e-fuse 113, and the third switching device 114. As the high electric current flows, the e-fuse 113 is programmed. The programmed e-fuse has a high resistance, for instance, 3 k-10 kΩ or above.

Figure 5:
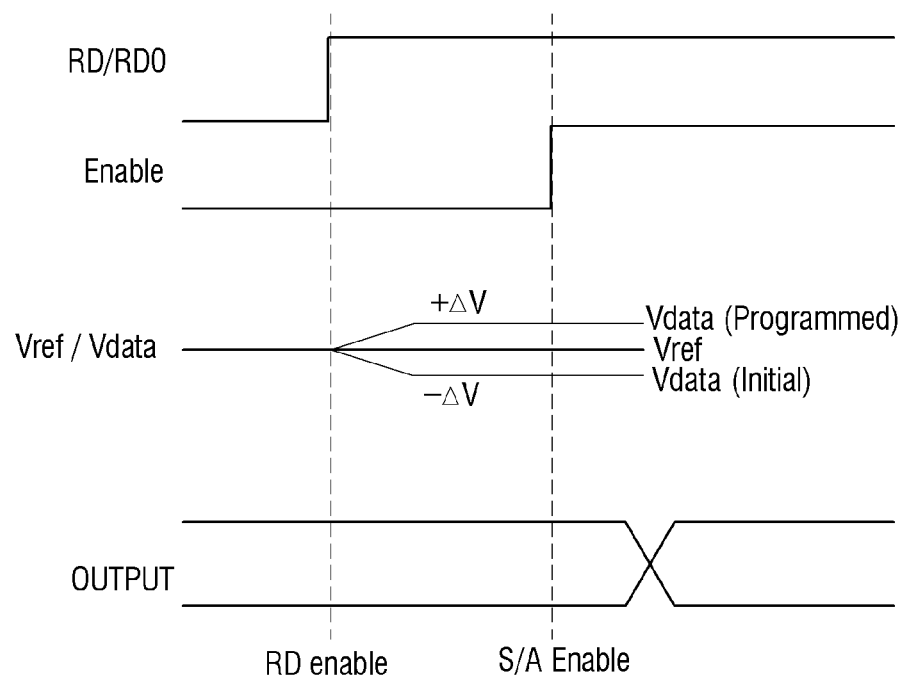
FIG. 5 is a circuit diagram provided illustrating an operation of an operation control unit during reading operation of a nonvolatile memory device, according to a first embodiment.

FIG. 5 is a circuit diagram provided illustrating an operation of an operation control unit during reading operation of a nonvolatile memory device, according to the first embodiment.

Referring to FIG. 5, when the cell select signal is low, the read current control unit 120 and the reference voltage generating unit 140 are in standby state, and no electric current flows separately.

When the operation control unit 160 provides the read voltage control unit 120 and the reference voltage generating unit 140 with the read control signal (RD/RDO), the read voltage is supplied to the selected unit cell and the reference voltage is generated. Accordingly, the selected unit cell has a predetermined voltage, and the reference voltage also has a predetermined voltage value.

After that, the operation control unit 160 inputs an enable signal to the sensing unit 130 so that the sensing unit 130 senses a difference between the reference voltage and the voltage of the e-fuse.

Figure 6:
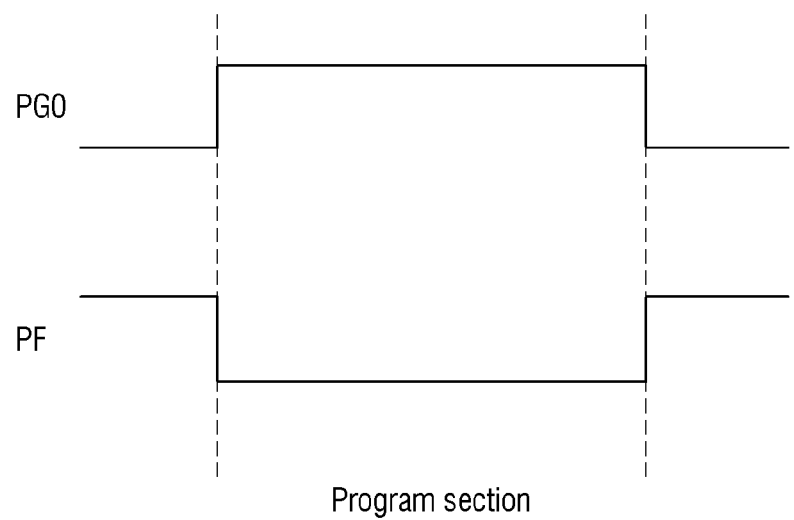
FIG. 6 is a circuit diagram provided illustrating an operation of an operation control unit during writing operation of a nonvolatile memory device, according to a first embodiment.

FIG. 6 is a circuit diagram provided illustrating an operation of an operation control unit during writing operation of a nonvolatile memory device, according to the first embodiment.

Referring to FIG. 6, the operation control unit 160 turns-off the respective switching devices within the reference voltage generating unit 140 that generates reference voltage. The operation control unit 160 then blocks enable signal so that the sensing unit 130 does not operate. The operation control unit 160 then turns-off the eighth switching device 121 so that the read voltage generating unit 120 does not provide the read voltage to the plurality of unit cells 110.

Subsequently, the operation control unit 160 selects a unit cell to perform the programming, and turns-on the third and fourteenth switching devices 114, 151 to supply the write electricity to the selected unit cell.

FIG. 7 is a circuit diagram of a nonvolatile memory device, according to a second embodiment.

Referring to FIG. 7, the nonvolatile memory device 300 according to the second embodiment includes a unit cell 310, a read current supply unit 320, a sensing unit 330, a reference voltage generating unit 340, and a read/write control unit 350.

Each of the plurality of unit cells 310 may include an e-fuse. That is, each of the plurality of unit cells 310 may include a fourth switching device 311, an e-fuse 312, and a fifth switching device 313.

The e-fuse 312 is a 1-bit programmable memory device that increases resistance by overcurrent. One end of the e-fuse 312 is connected to the source of the fourth switching device 311 and the drain of the fifth switching device 313. The other end is connected to the read/write control unit 350. The e-fuse 312 may be a poly fuse. By way of example, the e-fuse 312 may have approximately 50-200Ω before programming, and have approximately 3 k-10 kΩ after programming.

The fourth switching device 311 selectively provides the read voltage to the e-fuse 312. The fourth switching device 311 may be an nMOS, with a drain connected to the read voltage control unit 120 to receive read voltage, a gate receiving cell select signal, and a source commonly connected to one end of the e-fuse 312 and the drain of the fifth switching device 313.

The fifth switching device 313 allows electric current to flow the e-fuse 312 by the write voltage. The fifth switching device 313 may be an nMOS, with a drain commonly connected to one end of the e-fuse 312 and the source of the fourth switching device 311, a gate receiving write cell select signal, and a source being grounded. In one example, the fifth switching device 313 includes a larger size than the fourth switching device 311, considering that the write electric current is larger than the read electric current flowing therethrough.

The read current supply unit 320 provides the plurality of unit cells 310 with read voltage. The read current supply unit 320 includes the eighth switching device 321 and the first resistor 322.

The eighth switching device 321 selectively provides the plurality of unit cells 310 with the read voltage during reading operation of the nonvolatile memory device. The eighth switching device 321 may be a pMOS, with a source receiving a read voltage, a gate receiving an inversed read control signal, and a drain connected to one end of the first resistor 322.

The first resistor 322 has a first preset resistance. One end of the first resistor 322 is connected to the drain of the eighth switching device 321 and the other end is commonly connected to the plurality of unit cells 310 and the sensing unit 330. The first preset resistance may be a median (e.g., approximately 1.5-5Ω) between a resistance of the e-fuse when non-programmed of, for example, approximately 50-200Ω, and with a minimum resistance when programmed of, for example, approximately 3 k-10 kΩ. The first resistor 322 may be implemented as a non-salicide poly resistor including a predetermined resistance.

The sensing unit 330 compares the size of the voltage through the e-fuse 312 of the selected unit cell by the read voltage with the size of the reference voltage and detects the data of the e-fuse 312 of the selected unit cell. The sensing unit 330 may be configured as a sense-AMP that receives the voltage of the unit cell and the reference voltage, respectively, and outputs a difference therebetween. Accordingly, the sensing unit 330 determines that the selected e-fuse 312 is not programmed when the voltage through the selected e-fuse 312 is lower than the reference voltage generated at the reference voltage generating unit 340. Further, the sensing unit 330 determines that the selected e-fuse 312 is programmed when the size of the voltage through the selected e-fuse 312 is greater than the reference voltage generated at the reference voltage generating unit 340. In one illustrative example, the connecting end of the sense-AMP may be changed to determine that the programming is not done when the size of the reference voltage is lower than the voltage of the e-fuse 312.

The reference voltage generating unit 340 voltage-divides the read voltage using a plurality of series-connected resistors and generates a reference voltage based on the voltage-divided read voltage. The reference voltage generating unit 340 includes a voltage generating unit 341, a reference voltage decreasing unit 370, and a reference voltage increasing unit 380. In one example, the voltage generating unit 341 includes a second resistor 343, a third resistor 345, a ninth switching device 342, a tenth switching device 346 and an eleventh switching device 344.

The second resistor 343 has a second preset resistance. One end of the second resistor 343 is commonly connected to the drain of the ninth switching device 342 and the other end of the fourth resistor 372 of the reference voltage decreasing unit 370. The other end of the second resistor 343 is commonly connected to the sensing unit 330 and the drain of the eleventh switching device 344. The second preset resistance may be a median (e.g., approximately 1.5-5Ω) between the resistance (e.g., approximately 50-200Ω) when non-programmed and the minimum resistance when programmed (e.g., approximately 3 k-10 kΩ). The second resistor 343 may be implemented as a non-salicide poly resistor including a predetermined resistance.

The third resistor 345 has a third preset resistance connected in series to the second resistor 343. One end of the third resistor 345 is connected to the source of the eleventh switching device 344. The other end of the third resistor 345 is commonly connected to the drain of the tenth switching device 346 and the one end of the fifth resistor 382 of the reference voltage increasing unit 380. The third preset resistance may be a median of, for example, approximately 1.5-5Ω, between the resistance of, for example, approximately 50-200Ω, when non-programmed and the minimum resistance when programmed of, for example, approximately 3 k-10 kΩ. The third resistor 345 may be configured as a non-salicide poly resistor including a predetermined resistance.

The ninth switching device 342 selectively provides the read voltage to the second resistor 343. The ninth switching device 342 may be configured as a pMOS, with a source receiving the read voltage, a gate receiving an inversed read control signal, and a drain commonly connected to one end of the second resistor 343 and the fourth resistor 372.

The tenth switching device 346 allows the electric current to flow through the second and third resistors 343, 345 according to the read voltage. The tenth switching device 346 may be configured as a nMOS, with a drain commonly connected to the other end of the third resistor 345 and one end of the fifth resistor 382 of the reference voltage increasing unit 380, a gate receiving a read control signal, and a source being grounded.

The eleventh switching device 344 selectively connects the second and third resistors 344, 345. The eleventh switching device 344 may be configured as a nMOS, with a drain commonly connected to the other end of the second resistor 343 and the sensing unit 330, a gate receiving a read control signal, and a source connected to one end of the third resistor 345.

The reference voltage decreasing unit 370 decreases the reference voltage. The reference voltage decreasing unit 370 includes a twelfth switching device 371 and the fourth resistor 372.

The twelfth switching device 371 selectively provides the read voltage to the fourth resistor 372. The twelfth switching device 371 includes a pMOS, with a source receiving a read voltage, a gate receiving a first test control signal (RDP1), and a drain connected to one end of the fourth resistor 372.

The fourth resistor 372 is connected to the second resistor 343 in series, and has a fourth preset resistance. One end of the fourth resistor 372 is connected to the drain of the twelfth switching device 371. The other end of the fourth resistor 372 is commonly connected to the drain of the ninth switching device 342 and one end of the second resistor 343.

The reference voltage increasing unit 380 increases reference voltage. The reference voltage increasing unit 380 includes a thirteenth switching device 381 and a fifth resistor 382.

The thirteenth switching device 381 allows electric current to flow through the second resistor 343, the third resistor 345, and the fifth resistor 382 according to the read voltage. The thirteenth switching device 381 may be an nMOS, with a drain connected to the other end of the fifth resistor 382, a gate receiving a second test control signal (RDN1), and a source being grounded.

The fifth resistor 382 is connected to the third resistor 345 in series and has a fifth preset resistance. One end of the fifth resistor 382 is commonly connected to the other end of the third resistor 345 and the drain of the tenth switching device 346. The other end of the fifth resistor 382 is connected to the drain of the thirteenth switching device 381.

Based on the read voltage or the write voltage, the read/write control unit 350 selectively allows electric current to flow through the plurality of unit cells. The read/write control unit 350 includes a sixth switching device 351 and a seventh switching device 352.

The sixth switching device 351 selectively provides the write voltage to the unit cell during writing operation of the nonvolatile memory device. The sixth switching device 351 may be a pMOS, with a source receiving the write voltage, a gate receiving a write control signal, and a drain commonly connected to the drain of the seventh switching device and the other end of the e-fuse 312.

The seventh switching device 352 allows electric current to flow through the unit cell according to the read voltage during reading operation of the nonvolatile memory device. The seventh switching device 352 may be a nMOS, with a drain commonly connected to the drain of the sixth switching device 351 and the other end of the e-fuse 312, a gate receiving a read control signal, and a source being grounded.

The circuit configuration of the nonvolatile memory device according to the second embodiment has been explained above. Hereinbelow, the reading operation and writing operation will be explained in detail with reference to FIGS. 8 and 9, respectively. Further, referring to FIGS. 10 and 11, the first and second test operations will be explained.

Figure 8:
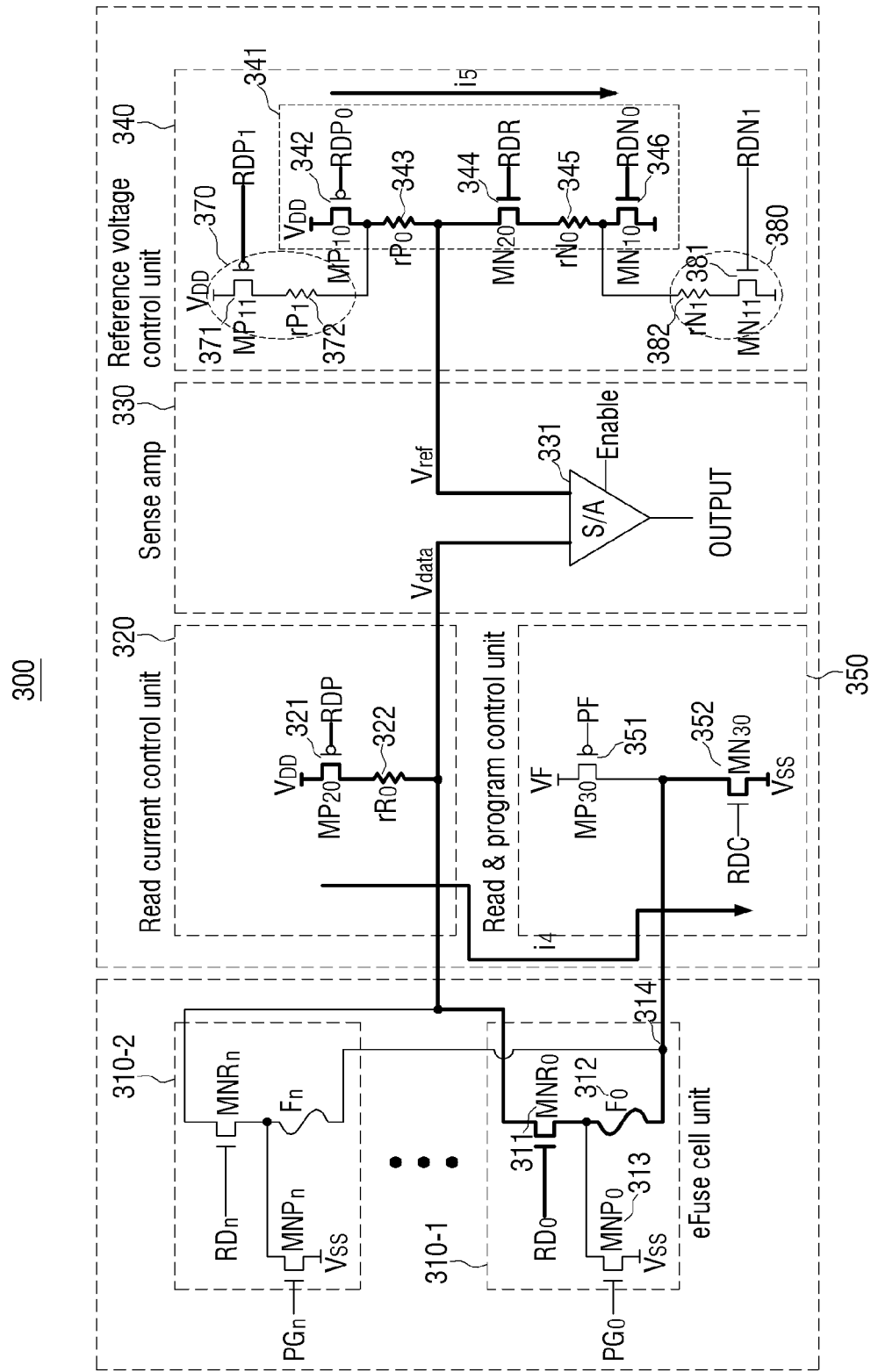
FIG. 8 is a circuit diagram provided illustrating a reading operation of a nonvolatile memory device, according to a second embodiment.

FIG. 8 is a circuit diagram provided illustrating a reading operation of a nonvolatile memory device, according to the second embodiment.

Referring to FIG. 8, the operation control unit 160 selects a unit cell to perform reading operation and provides a cell select signal RDO to the corresponding unit cell 310-1. Accordingly, the fourth switching device 311 is turned-on. The fifth switching device 313 is in an off state.

The operation control unit 160 controls the read current supply unit 320, the reference voltage generating unit 340, and the read/write control unit 350 so that the read voltage is provided to the selected unit cell and a reference voltage is generated. Accordingly, the seventh switching device 352, the eighth switching device 321, the ninth switching device 342, the tenth switching device 346, and the eleventh switching device 344 are turned-on. The sixth switching device 351, the twelfth switching device 371, and the thirteenth switching device 381 are in an off state.

Once the switching devices are turned-on, an electric current path $i_4$ is formed between the eighth switching device 321, the first resistor 322, the fourth switching device 311, the e-fuse 312, and the seventh switching device 352. Additionally, an electric current path $i_5$ is formed between the ninth switching device 342, the second resistor 343, the eleventh switching device 344, the third resistor 345, and the tenth switching device 346.

Because the same number of switching devices passing the electric current paths exists through the electric current paths $i_4$ and $i_5$, characteristics of the transistor can be prevented and it is possible to determine whether the resistance of the e-fuse exceeds the reference resistance. By way of example, when the e-fuse is before programming, because the e-fuse has a resistance lower than the first to third resistances 322, 343, and 345, the voltage at the e-fuse is lower than the voltage value which is voltage-divided by the second and third resistors. In contrast, when the e-fuse is programmed, because the e-fuse has the resistance higher than the first to third resistors 322, 343, and 345, the voltage at the e-fuse is higher than the voltage value which is voltage-divided by the second and third resistors. Accordingly, by comparing the voltage at the e-fuse with the reference voltage, the sensing unit 330 may determine whether the e-fuse is programmed or not.

Figure 9:
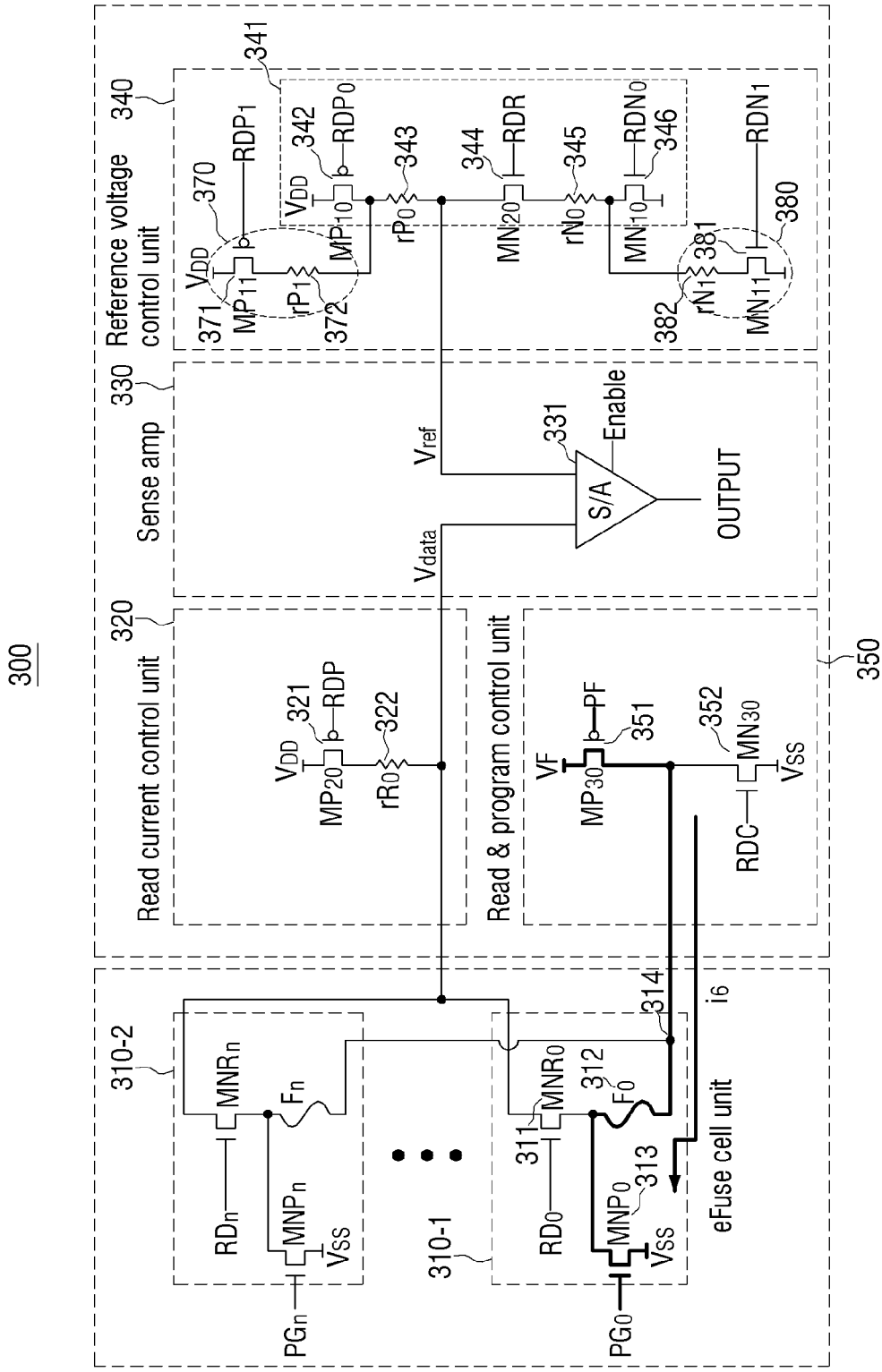
FIG. 9 is a circuit diagram provided illustrating a writing operation of a nonvolatile memory device, according to a second embodiment.

FIG. 9 is a circuit diagram provided illustrating a writing operation of a nonvolatile memory device, according to the second embodiment.

Referring to FIG. 9, the operation control unit 160 selects a unit cell to perform writing operation and provides a cell select signal PGO to the corresponding unit cell 310-1. Accordingly, the fifth switching device 313 is turned-on. The fourth switching device 311 is in an off state.

The operation control unit 160 controls the read/write control unit 350 to provide the write voltage to the selected unit cell. Accordingly, the sixth switching device 351 is turned-on. The sevenths switching device 352 is in an off state.

When the fifth switching device 313 and the sixth switching device 351 are turned-on, an electric path $i_6$ is formed between the sixth switching device 351, the e-fuse 312, and the fifth switching device 313. Accordingly, high electric current flows through the e-fuse 312 for programming. The programmed e-fuse has high resistance of, for example, 3 k-10 kΩ.

Figure 10:
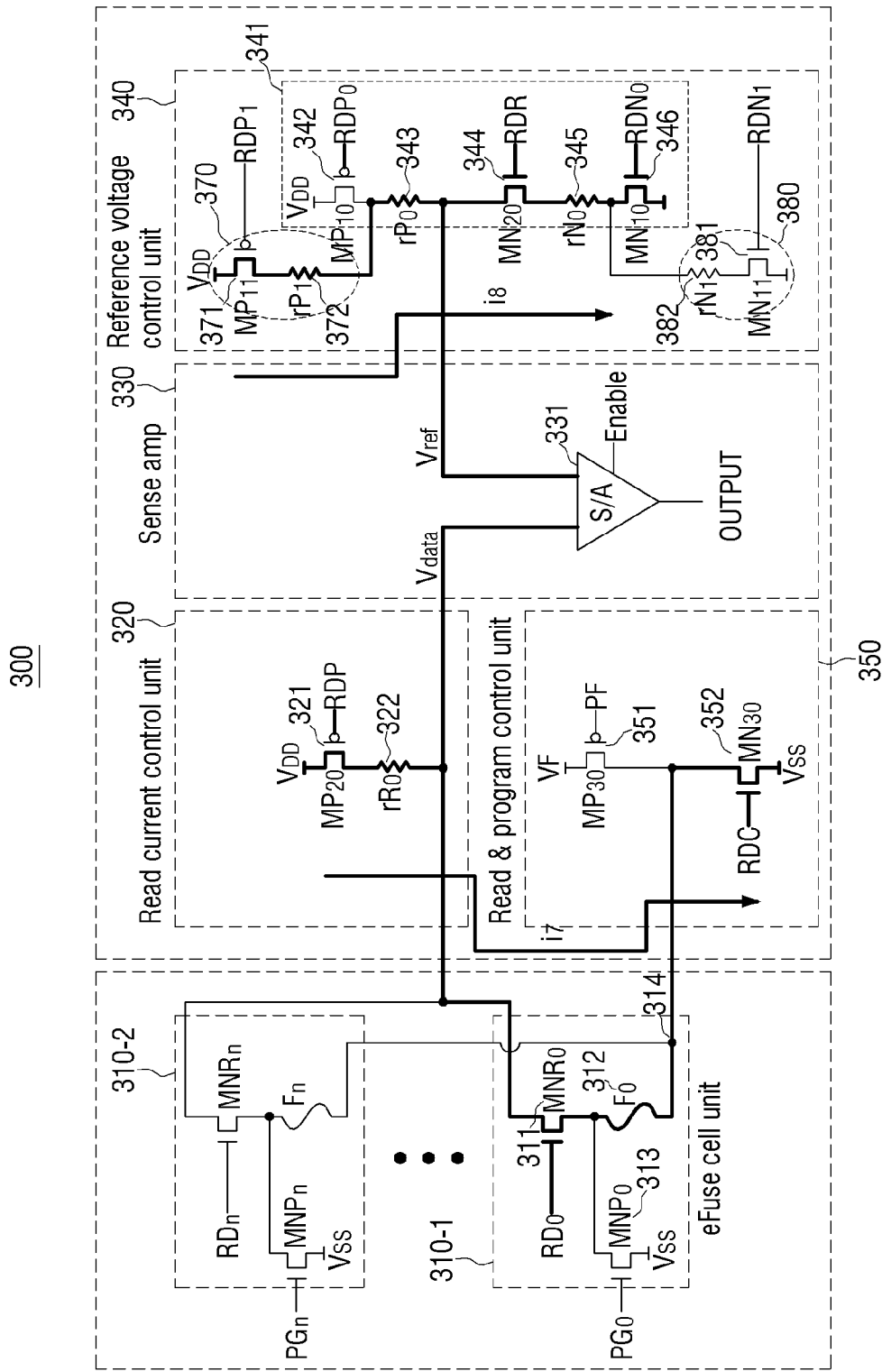
FIGS. 10 and 11 are circuit diagrams provided illustrating a test operation of a nonvolatile memory device, according to a second embodiment.

FIG. 10 is a circuit diagram provided illustrating the first test operation of the nonvolatile memory device, according to the second embodiment. The first test operation is implemented to test whether the non-programmed e-fuse has a resistance below a preset value. Accordingly, the first test operation lowers the reference voltage to a preset size for test purpose.

Referring to FIG. 10, the operation control unit 160 selects a unit cell to perform test operation and provides a cell select signal RDO to the corresponding unit cell 310-1. Accordingly, the fourth switching device 311 is turned-on. The fifth switching device 313 is in an off state.

The operation control unit 160 then controls the read current supply unit 320, the reference voltage generating unit 340, and the read/write control unit 350 so that the read voltage is provided to the selected unit cell, and a first test reference voltage (to be specific, voltage lower than reference voltage) is generated as a first test voltage. Accordingly, the seventh switching device 352, the eighth switching device 321, the tenth switching device 346, the eleventh switching device 344 and the twelfth switching device 371 are turned-on. The ninth switching device 342 and the thirteenth switching device 381 are in an off state.

According to the turn-on of the switching devices, an electric current path $i_7$ is formed between the eighth switching device 321, the first resistor 322, the fourth switching device 311, the e-fuse 312, and the seventh switching device 352.

An electric current path $i_8$ is also formed between the twelfth switching device 371, the fourth resistor 372, the second resistor 343, the eleventh switching device 344, the third resistor 345 and the tenth switching device 346.

Because the fourth resistor 372 is connected to an upper portion of the circuit, the reference voltage generating unit 340 generates a lower reference voltage than the conventional reference voltage. However, such lower reference voltage is higher than the voltage of the e-fuse in a normal state. Accordingly, when the e-fuse before programming is in the normal state, the voltage at the e-fuse is lower than the decreased reference voltage. When the e-fuse before programming is not in the normal state, the voltage at the e-fuse is higher than the decreased reference voltage. Accordingly, the sensing unit 330 can determine whether the e-fuse before programming is in a normal state by comparing the voltage of the e-fuse with the decreased reference voltage.

Figure 11:
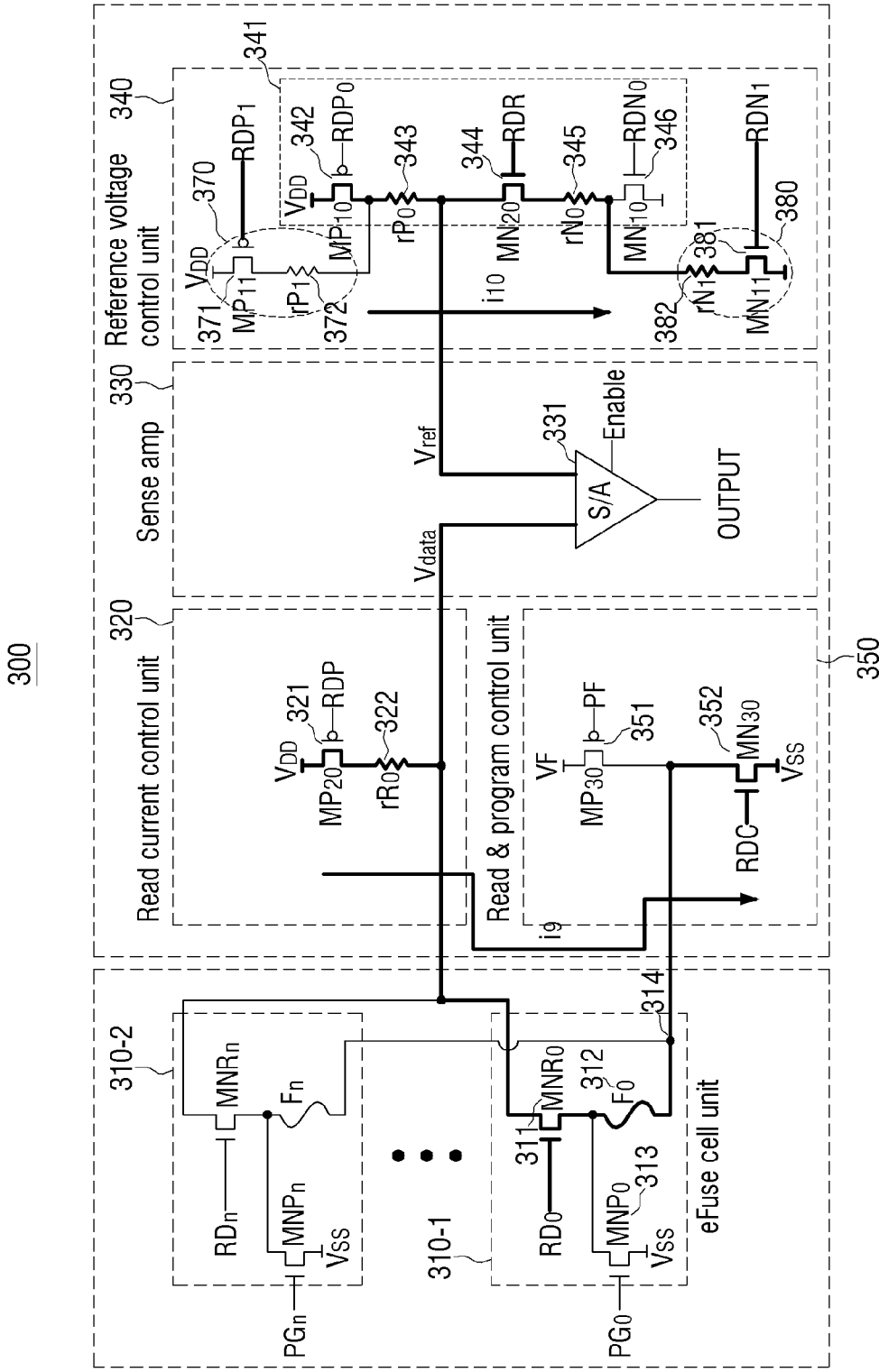

FIG. 11 is a circuit diagram provided illustrating a second test operation of a nonvolatile memory device, according to the second embodiment. In order to determine whether the programmed e-fuse exceeds a preset resistance, the second test operation includes increasing the reference voltage to a preset size for testing purpose.

Referring to FIG. 11, the operation control unit 160 selects a unit cell to perform the second test operation, and provides a cell select signal RDO to the corresponding unit cell 310-1. Accordingly, the fourth switching device 311 is turned-on. The fifth switching device 313 is in an off state.

The operation control unit 160 controls the read current supply unit 320, the reference voltage generating unit 340, and the read/write control unit 350 so that the read voltage is output to the selected unit cell and the second test voltage is generated. The second test voltage is a voltage higher than reference voltage. As a result, the seventh switching device 352, the eighth switching device 321, the ninth switching device 342, the eleventh switching device 344, and the thirteenth switching device 381 are turned-on. The tenth switching device 346 and the twelfth switching device 371 are in an off state.

According to the turn-on of the switching devices, an electric current path $i_9$ is formed between the eighth switching device 321, the first resistor 322, the fourth switching device 311, the e-fuse 312, and the seventh switching device 352.

Furthermore, an electric current path $i_{10}$ is formed between the ninth switching device 342, the second resistor 343, the eleventh switching device 344, the third resistor 345, the fifth resistor 382, and the thirteenth switching device 381.

Because the fifth resistor 382 is connected to a lower portion of the reference voltage control unit 340, the reference voltage generating unit 340 generates a higher reference voltage than the conventional reference voltage. However, such higher reference voltage is lower than the voltage of an e-fuse operating in a normal state. When the e-fuse after programming is in a normal state, the voltage at the e-fuse is higher than the increased reference voltage. When the e-fuse after programming is not in normal state, the voltage at the e-fuse is lower than the increased reference voltage. Thus, the sensing unit 330 can determine whether the e-fuse after programming is in a normal state by comparing the voltage of the e-fuse with the increased reference voltage.

Figure 12:
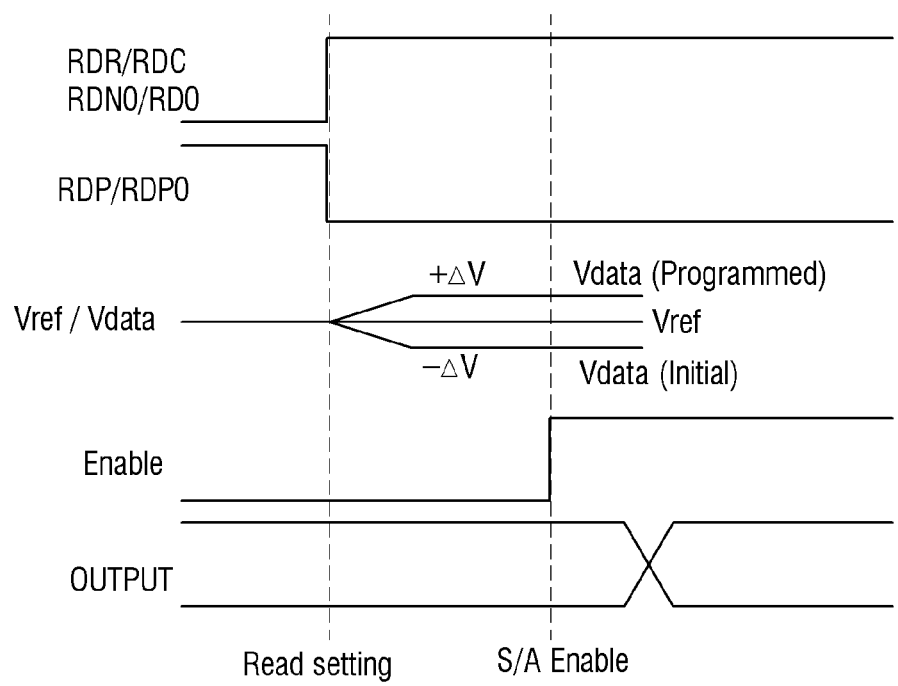
FIG. 12 is a circuit diagram provided illustrating an operation of an operation control unit during reading operation of a nonvolatile memory device, according to a second embodiment.

FIG. 12 is a circuit diagram provided illustrating operation of an operation control unit during reading operation of a nonvolatile memory device, according to the second embodiment.

Referring to FIG. 12, when the cell select signal is low, the read current control unit 320, the reference voltage generating unit 340, and the read/write control unit 350 are in a standby state, and no electric current flows through.

When the operation control unit 160 outputs the read voltage control unit 320 and the reference voltage generating unit 340 with the read control signals (RDR, RDC, RDNO, RDO, RDP, RDPO), the read voltage is supplied to a selected unit cell and the reference voltage is generated. Accordingly, the selected unit cell has a predetermined voltage, and the reference voltage also has a predetermined voltage value.

Subsequently, the operation control unit 160 inputs an enable signal to the sensing unit 330 so that the sensing unit 330 senses a difference between the reference voltage and the voltage of the e-fuse.

Figure 13:
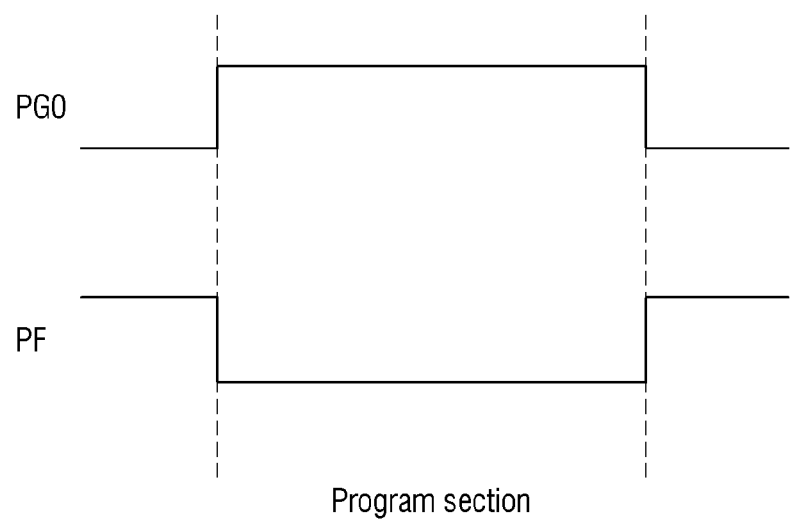
FIG. 13 is a circuit diagram provided illustrating an operation of an operation control unit during writing operation of a nonvolatile memory device, according to a second embodiment.

FIG. 13 is a circuit diagram provided illustrating an operation of an operation control unit during writing operation of a nonvolatile memory device, according to the second embodiment.

Referring to FIG. 13, the operation control unit 160 turns-off the respective switching devices within the reference voltage generating unit 340 that generates the reference voltage. The operation control unit 160 then blocks an enable signal so that the sensing unit 330 does not operate. The operation control unit 160 then turns-off the eighth switching device 321 so that the read voltage generating unit 320 does not provide the read voltage to the plurality of unit cells 310.

Subsequently, the operation control unit 160 selects a unit cell to perform the programming, and turns-on the sixth switching device 351 to supply the write electricity to the selected unit cell. The seventh switching device 352 is in an off state.

Figure 14:
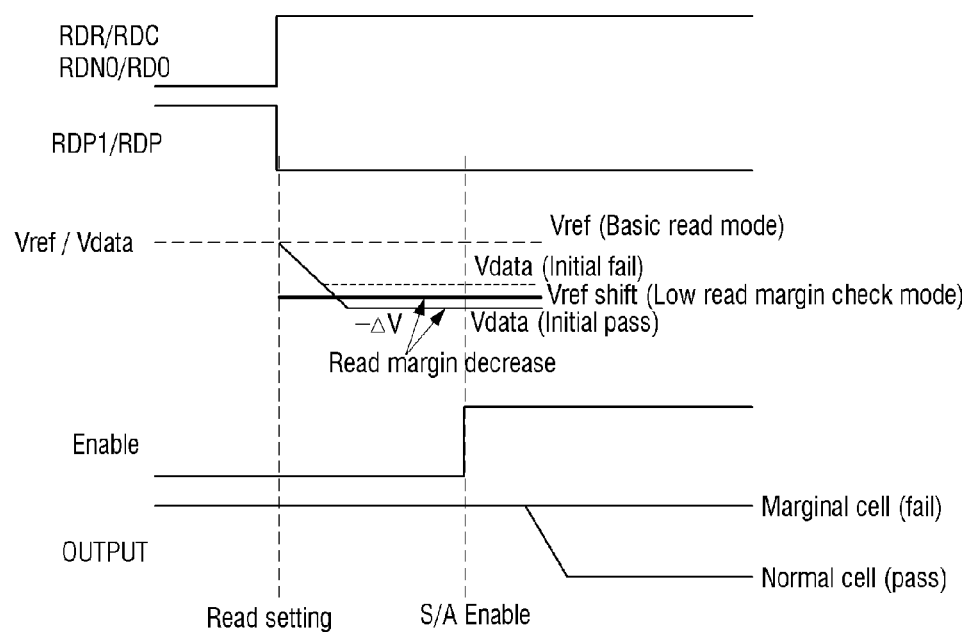
FIG. 14 is a view provided illustrating an operation of an operation control unit during first test operation of a nonvolatile memory device, according to a second embodiment.

FIG. 14 is a view provided illustrating an operation of an operation control unit during first test operation of a nonvolatile memory device according to the second embodiment.

Referring to FIG. 14, when the cell select signal is low, the read current control unit 320, the reference voltage generating unit 340 and the read/write control unit 350 are in standby state, and no electric current flows separately.

When the operation control unit 160 provides the read voltage control unit 320 and the reference voltage generating unit 340 with the read control signals (RDR, RDC, RDNO, RDO, RDP, RDPO), the read voltage is supplied to the selected unit cell and the decreased reference voltage is generated. Accordingly, the selected unit cell has a predetermined voltage, and the decreased reference voltage also has a predetermined voltage value.

After that, the operation control unit 160 inputs an enable signal to the sensing unit 330 so that the sensing unit 330 senses a difference between the decreased reference voltage and the voltage of the e-fuse.

Figure 15:
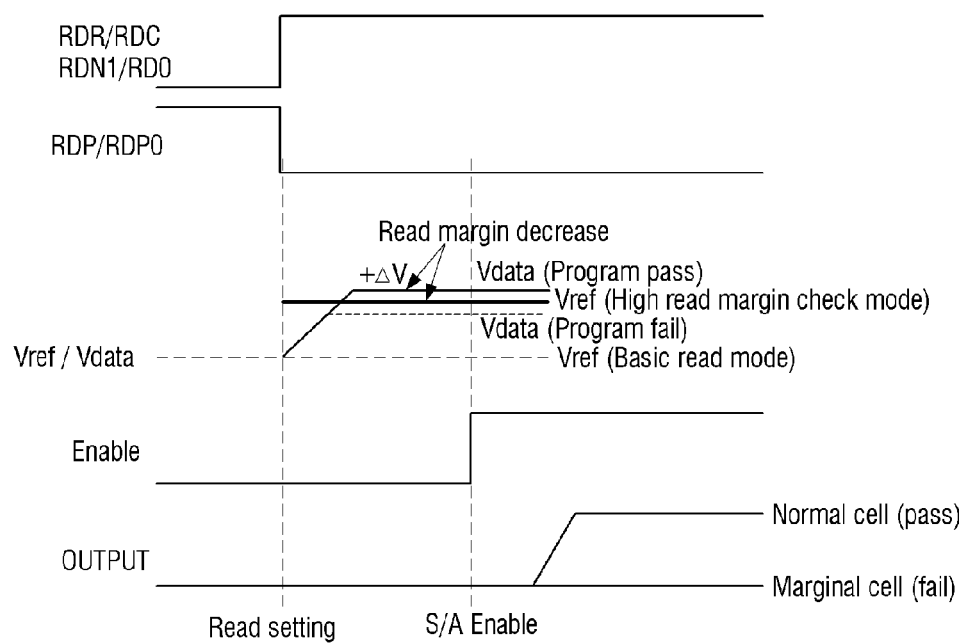
FIG. 15 is a view provided illustrating an operation of an operation control unit during second test operation of a nonvolatile memory device, according to a second embodiment.

FIG. 15 is a view provided illustrating an operation of an operation control unit during second test operation of a nonvolatile memory device, according to the second embodiment.

Referring to FIG. 15, when the cell select signal is low, the read current control unit 320, the reference voltage generating unit 340, and the read/write control unit 350 are in standby state, and no electric current flows separately.

When the operation control unit 160 outputs the read voltage control unit 320 and the reference voltage generating unit 340 with the read control signals (RDR, RDC, RDNO, RDO, RDP, RDPO), the read voltage is supplied to the selected unit cell and the increased reference voltage is generated. Accordingly, the selected unit cell has a predetermined voltage, and the increased reference voltage also has a predetermined voltage value.

Subsequently, the operation control unit 160 inputs an enable signal to the sensing unit 330 so that the sensing unit 330 senses a difference between the increased reference voltage and the voltage of the e-fuse.

As explained above, the reference voltage is increased or decreased by selectively connecting resistors to both ends of a plurality of resistors to generate a reference voltage. However, such configuration is one example, and accordingly, in another configuration, only the switching devices with different on resistances would be used to decrease or increase the reference voltage, without using additional resistors. Such other configuration is illustrated and described below with reference to FIGS. 16 and 17.

Figure 16:
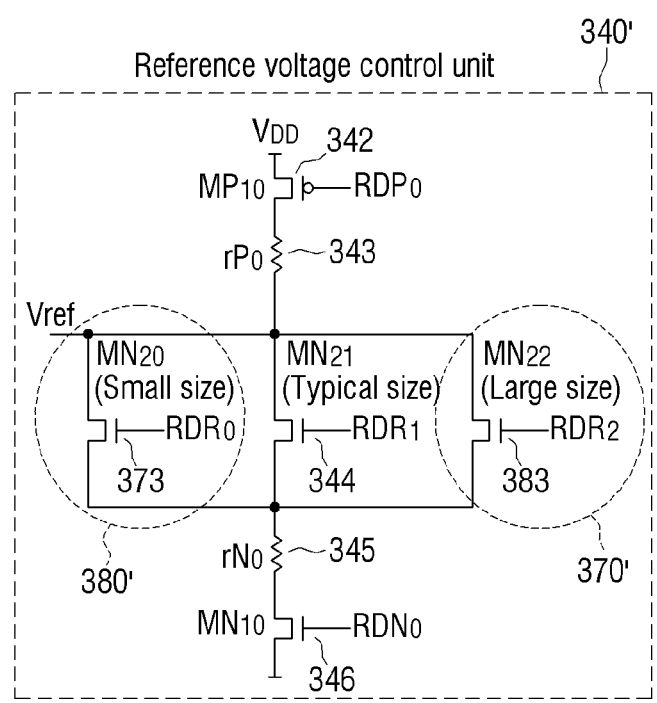
FIG. 16 is a circuit diagram of a reference voltage generating unit, according to another embodiment.

FIG. 16 is a circuit diagram of a reference voltage generating unit, according to another embodiment. To be specific, the reference voltage generating unit of FIG. 16 may replace the reference voltage generating unit 140 of FIG. 2 or the reference voltage generating unit 340 of FIG. 7.

The reference voltage generating unit 340' voltage-divides the read voltage by using a plurality of series-connected resistors, and generates a reference voltage based on the voltage-divided read voltage. The reference voltage generating unit 340' may include a second resistor 343, a third resistor 345, a ninth switching device 342, a tenth switching device 346, an eleventh switching device 344, a reference voltage increasing unit 380', and a reference voltage decreasing unit 370'.

The second resistor 343 has a second preset resistance. One end of the second resistor 343 is connected to the drain of the ninth switching device 342. The other end of the second resistor 343 is commonly connected to the sensing unit 330, the drain of the eleventh switching device 344, the drain of the fifteenth switching device 373 of the reference voltage increasing unit 380', and the drain of the sixteenth switching device 383 of the reference voltage decreasing unit 370'. The second preset resistance may be a median (e.g., approximately 1.5-5Ω) between the non-programmed resistance of e-fuse 312 of approximately 50-200Ω, as shown in FIG. 7, for instance, and the minimum resistance when programmed of, for instance, approximately 3 k-10 kΩ. The second resistor 343 may be configured as a non-salicide poly resistor to have a predetermined resistance.

The third resistor 345 has a third preset resistance connected to the second resistor 343 in series. One end of the third resistor 345 may be connected to the source of the eleventh switching device 344, a source of the fifteenth switching device 373 of the reference voltage increasing unit 380', and a source of the sixteenth switching device 383 of the reference voltage decreasing unit 370'. The other end thereof may be connected to the drain of the tenth switching device 346. The third preset resistance may be a median of, for example, approximately 1.5-5Ω, between the non-programmed resistance of the e-fuse 312, of for example, approximately 50-200Ω, and the minimum resistance when programmed of, for example, approximately 3 k-10 kΩ. The third resistor 345 may be implemented as a non-salicide poly resistor to have a predetermined resistance.

The ninth switching device 342 selectively provides the read voltage to the second resistor 343. The ninth switching device 342 may be implemented as a pMOS, with a source receiving the read voltage, a gate receiving an inversed read control signal, and a drain connected to one end of the second resistor 343.

The tenth switching device 346 allows the electric current to flow through the second and third resistors 343, 345 according to the read voltage. The tenth switching device 346 may be implemented as an nMOS, with a drain connected to the other end of the third resistor 345, a gate receiving a read control signal, and a source being grounded.

The eleventh switching device 344 selectively connects the second and third resistors 343, 345. The eleventh switching device 344 may be implemented as an nMOS, with a drain commonly connected to the other end of the second resistor 343, the sensing unit 330, the drain of the fifteenth switching device 373 of the reference voltage increasing unit 380' and the drain of the sixteenth switching device 383 of the reference voltage decreasing unit 370'. A gate of the nMOS, that is, of the eleventh switching device 344, receives a read control signal (RDRI), and a source of the nMOS is commonly connected to one end of the third resistor 345, the source of the fifteenth switching device 373 of the reference voltage increasing unit 370' and the source of the sixteenth switching device 383 of the reference voltage decreasing unit 370'.

The reference voltage increasing unit 380' increases reference voltage. The reference voltage increasing unit 380' includes the fifteenth switching device 373.

The fifteenth switching device 373 has a higher on-resistance than an on-resistance of the eleventh switching device 344, and is connected in parallel to the eleventh switching device 344. The fifteenth switching device 373 may be implemented as a nMOS, with a drain commonly connected to the other end of the second resistor 343, the sensing unit 330, the drain of the eleventh switching device 344, and the drain of the sixteenth switching device 383 of the reference voltage decreasing unit 370'. A gate of the nMOS, as the fifteenth switching device 373, receives a first test control signal RDRO. A source of the nMOS, as the fifteenth switching device 373, is commonly connected to one end of the third resistor 345, the source of the eleventh switching device 344, and the source of the sixteenth switching device 383 of the reference voltage decreasing unit 370'. The on resistance of the fifteenth switching device 373 may include a sixth preset resistance that is higher than an on-resistance of the eleventh a sixth preset resistance 344.

The reference voltage decreasing unit 370' decreases reference voltage. The reference voltage decreasing unit 370' includes the sixteenth switching device 383.

The sixteenth switching device 383 has a lower on-resistance than an on-resistance of the eleventh switching device 344, and is connected in parallel to the eleventh switching device 344. The sixteenth switching device 383 may be implemented as a nMOS, with a drain commonly connected to the other end of the second resistor 343, the sensing unit 330, the drain of the eleventh switching device 344 and the drain of the fifteenth switching device 373 of the reference voltage increasing unit 380'. A gate of the nMOS, as the sixteenth switching device 373, receives a second test control signal RDR2. A source of the nMOS, as the sixteenth switching device 373, source is commonly connected to one end of the third resistor 345, the source of the eleventh switching device 344, and the source of the fifteenth switching device 373 of the reference voltage increasing unit 380'. The on-resistance of the sixteenth switching device 383 may include a sixth preset resistance that is lower than the on-resistance of the eleventh switching device 344.

Figure 17:
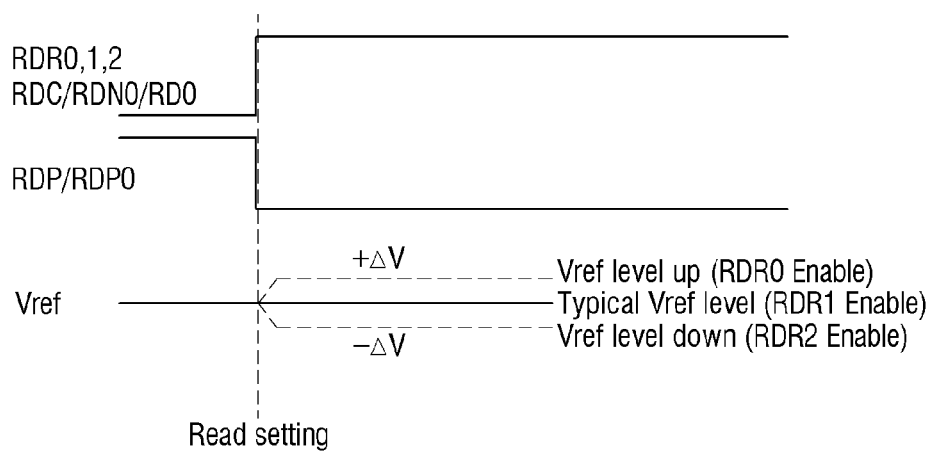
FIG. 17 is a view provided illustrating an operation of an operation control unit with respect to a reference voltage generating unit, according to another embodiment.

FIG. 17 is a view provided illustrating an operation of an operation control unit with respect to a reference voltage generating unit, according to another embodiment.

Referring to FIG. 17, when the cell select signal is low, the read current control unit 320, the reference voltage generating unit 340', and the read/write control unit 350 are in standby state, and no electric current flows through.

When the operation control unit 160 provides the read voltage control unit 320 and the reference voltage generating unit 340' with the read control signals (RDRO, RDR1, RDR2, RDC, RDNO, RDO, RDP, RDPO), the read voltage is supplied to the selected unit cell and the reference voltage is generated. Accordingly, the selected unit cell has a predetermined voltage, and the reference voltage also has a predetermined voltage value.

For general reading operation, the operation control unit 160 maintains RDRO, RDR2 signals low, and outputs RDR1 signal as high. Accordingly, the reference voltage generating unit 340' generates a preset reference voltage. The operation control unit 160 maintains RDR1, RDR2 signals low during the first test operation, and outputs RDRO signal as high. Accordingly, the reference voltage generating unit 340' generates a reference voltage higher than a preset reference voltage. For the second test operation, the operation control unit 160 maintains RDRO, RDR1 signals low, and outputs RDR2 signal as high. Accordingly, the reference voltage generating unit 340' generates a reference voltage lower than a preset reference voltage.

It will be understood that, although the terms first, second, third, etc. may be used herein to describe various elements, components, units and/or sections, these elements, components, units and/or sections should not be limited by these terms. These terms are only used to distinguish one element, component, unit or section from another region, layer or section. These terms do not necessarily imply a specific order or arrangement of the elements, components, regions, layers and/or sections. Thus, a first element, component, unit or section discussed below could be termed a second element, component, unit or section without departing from the teachings description of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The invention claimed is:

1. A nonvolatile memory device, comprising:
   unit cells comprising an e-fuse and an input unit configured to provide the e-fuse with a write voltage during a writing operation of the nonvolatile memory device;
   a read current supply unit which provides a read voltage to the unit cells during reading operation of the nonvolatile memory device;
   an operation control unit configured to select a unit cell from the unit cells to perform reading and writing operations;
   a reference voltage generating unit configured to voltage-divide the read voltage using series-connected resistors and generate a reference voltage based on the voltage-divided read voltage; and
   a sensing unit configured to compare a size of a voltage through an e-fuse of the selected unit cell based on the read voltage with the reference voltage, and sense data of the e-fuse of the selected unit cell, wherein the e-fuse is configured to store 1-bit information and the unit cells comprise
   a first switching device configured to selectively output the read voltage to the e-fuse of the unit cells,
   a second switching device configured to enable an electric current to flow through the e-fuse of the unit cells according to the read voltage, and
   a third switching device configured to enable electric current to flow through the e-fuse according to the write voltage.

2. The nonvolatile memory device of claim 1, wherein the first switching device comprises an n-type metal-oxide-semiconductor field-effect transistor (nMOS), with a drain connected to the read current supply unit, a gate receiving a cell select signal, and a source connected to one end of the e-fuse, and the second switching device is an nMOS, with a drain connected to the other end of the e-fuse, a gate receiving the cell select signal, and a source being grounded.

3. The nonvolatile memory device of claim 1, wherein the third switching device is an n-type metal-oxide-semiconductor field-effect transistor (nMOS), with a drain connected to one end of the e-fuse, a gate receiving a cell select signal, and a source being grounded.

4. The nonvolatile memory device of claim 1, further comprising:
   a read/write control unit configured to selectively enable electric current based on a read voltage or electric current based on a write voltage to flow through the unit cells.

5. A nonvolatile memory device, comprising:
   unit cells comprising an e-fuse and an input unit configured to provide the e-fuse with a write voltage during a writing operation of the nonvolatile memory device;
   a read current supply unit which provides a read voltage to the unit cells during reading operation of the nonvolatile memory device;
   an operation control unit configured to select a unit cell from the unit cells to perform reading and writing operations;
   a reference voltage generating unit configured to voltage-divide the read voltage using series-connected resistors and generate a reference voltage based on the voltage-divided read voltage; and
   a sensing unit configured to compare a size of a voltage through an e-fuse of the selected unit cell based on the read voltage with the reference voltage, and sense data of the e-fuse of the selected unit cell; wherein the unit cells comprise
   a fourth switching device configured to selectively output the read voltage to the e-fuse, wherein one end of the e-fuse is connected to the fourth switching device and the other end is connected to a read/write control unit.

6. The nonvolatile memory device of claim 5, wherein a drain of the fourth switching device receives the read voltage, a gate receives a cell select signal, and a source is connected to one end of the e-fuse.

7. The nonvolatile memory device of claim 5, wherein the unit cells further comprise a fifth switching device configured to enable electric current to flow through the e-fuse according to the write voltage.

8. The nonvolatile memory device of claim 7, wherein the fifth switching device is an n-type metal-oxide-semiconductor field-effect transistor (nMOS), with a drain connected to one end of the e-fuse, a gate receiving a cell select signal, and a source being grounded.

9. The nonvolatile memory device of claim 5, wherein the read/write control unit comprises:
   a sixth switching device configured to selectively output a write voltage to the unit cells during the writing operation of the nonvolatile memory device; and
   a seventh switching device configured to enable electric current to flow through the unit cells based on the read voltage during the reading operation of the nonvolatile memory device.

10. The nonvolatile memory device of claim 9, wherein the sixth switching device is a p-type metal-oxide-semiconductor field-effect transistor (pMOS), with a source receiving the write voltage, a gate receiving a write control signal, and a drain commonly connected to one end of the seventh switching device and the e-fuse, and the seventh switching device is an n-type metal-oxide-semiconductor field-effect transistor (nMOS), with a drain commonly connected to a drain of the sixth switching device and the e-fuse, a gate receiving a read control signal, and a source being grounded.

11. The nonvolatile memory device of claim 5, wherein the read current supply unit comprises:
an eighth switching device configured to selectively output a read voltage to the unit cells during the reading operation of the nonvolatile memory device; and
a first resistor comprising a first preset resistance.

12. The nonvolatile memory device of claim 11,
wherein the eighth switching device is a p-type metal-oxide-semiconductor field-effect transistor (pMOS), with a source receiving a read voltage, a gate receiving an inversed read control signal, and a drain connected to one end of the first resistor, and
wherein one end of the first resistor is connected to drain of the eighth switching device, and the other end is commonly connected to the unit cells and a comparing unit.

13. The nonvolatile memory device of claim 11, wherein the sensing unit determines that the selected e-fuse is not programmed when the voltage through the selected e-fuse is lower than the reference voltage, and determines that the selected e-fuse is programmed when the voltage through the selected e-fuse is greater than the reference voltage.

14. The nonvolatile memory device of claim 5, wherein the read current supply unit comprises:
an eighth switching device configured to selectively output a read voltage to the unit cells during the reading operation of the nonvolatile memory device; and
a first resistor comprising a first preset resistance.

15. The nonvolatile memory device of claim 14,
wherein the eighth switching device is a p-type metal-oxide-semiconductor field-effect transistor (pMOS), with a source receiving a read voltage, a gate receiving an inversed read control signal, and a drain connected to one end of the first resistor, and
wherein one end of the first resistor is connected to drain of the eighth switching device, and the other end is commonly connected to the unit cells and a comparing unit.

16. The nonvolatile memory device of claim 14, wherein the sensing unit determines that the selected e-fuse is not programmed when the voltage through the selected e-fuse is lower than the reference voltage, and determines that the selected e-fuse is programmed when the voltage through the selected e-fuse is greater than the reference voltage.

17. A nonvolatile memory device, comprising:
unit cells comprising an e-fuse and an input unit configured to provide the e-fuse with a write voltage during a writing operation of the nonvolatile memory device;
a read current supply unit which provides a read voltage to the unit cells during reading operation of the nonvolatile memory device;
an operation control unit configured to select a unit cell from the unit cells to perform reading and writing operations;
a reference voltage generating unit configured to voltage-divide the read voltage using series-connected resistors and generate a reference voltage based on the voltage-divided read voltage; and
a sensing unit configured to compare a size of a voltage through an e-fuse of the selected unit cell based on the read voltage with the reference voltage, and sense data of the e-fuse of the selected unit cell,
wherein the read current supply unit comprises
an eighth switching device configured to selectively output a read voltage to the unit cells during the reading operation of the nonvolatile memory device, and
a first resistor comprising a first preset resistance, and
wherein the reference voltage generating unit comprises
a second resistor comprising a second preset resistance,
a third resistor comprising a third preset resistance and configured to be connected in series to the second resistor,
a ninth switching device configured to selectively output the read voltage to the second resistor, and
a tenth switching device configured to enable an electric current to flow through the second and third resistors according to the read voltage.

18. The nonvolatile memory device of claim 17, wherein the reference voltage generating unit further comprises an eleventh switching device configured to selectively connect the second and third resistors.

19. The nonvolatile memory device of claim 18, wherein the ninth switching device is a p-type metal-oxide-semiconductor field-effect transistor (pMOS), with a source receiving a read voltage, a gate receiving an inversed read control signal, and a drain connected to one end of the second resistor,
one end of the second resistor is connected to a drain of the ninth switching device and the other end is connected to the sensing unit,
the eleventh switching device is an n-type metal-oxide-semiconductor field-effect transistor (nMOS), with a drain commonly connected to the other end of the second resistor and the sensing unit, a gate receiving a read control signal, and a source connected to one end of the third resistor,
one end of the third resistor is connected to a source of the eleventh switching device, and
the tenth switching device is an nMOS, with a drain connected to the other end of the third resistor, a gate receiving a read control signal, and a source being grounded.

20. The nonvolatile memory device of claim 18, wherein the reference voltage generating unit further comprises:
a reference voltage increasing unit configured to increase the reference voltage; and
a reference voltage decreasing unit configured to decrease the reference voltage.

21. The nonvolatile memory device of claim 20, wherein the reference voltage decreasing unit comprises:
a fourth resistor configured to be connected in series with the second resistor, and configured to comprise a fourth preset resistance; and
a twelfth switching device configured to selectively output the fourth resistor with the read voltage.

22. The nonvolatile memory device of claim 21, wherein the twelfth switching device is a p-type metal-oxide-semiconductor field-effect transistor (pMOS), with a source receiving the read voltage, a gate receiving a first test control signal, and a drain connected to one end of the fourth resistor.

23. The nonvolatile memory device of claim 20, wherein the reference voltage decreasing unit comprises a fifteenth switching device comprising an on-resistance lower than on-resistance of the eleventh switching device, and configured to be connected in parallel with the eleventh switching device.

24. The nonvolatile memory device of claim 20, wherein the reference voltage increasing unit comprises:
a fifth resistor configured to be connected in series with the third resistor, and configured to comprise has a fifth preset resistance; and
a thirteenth switching device configured to selectively enable electric current to flow through the second, third, and fifth resistors according to the read voltage.

25. The nonvolatile memory device of claim 24, wherein the thirteenth switching device is an n-type metal-oxidesemiconductor field-effect transistor (nMOS), with a drain connected to the other end of the fifth resistor, a gate receiving a second test control signal, and source being grounded.

26. The nonvolatile memory device of claim 20, wherein the reference voltage increasing unit comprises a sixteenth switching device comprising an on-resistance higher than on-resistance of the eleventh switching device, and configured to be connected in parallel with the eleventh switching device.

\* \* \* \* \*